(12) United States Patent
Sasayama et al.

(10) Patent No.: US 6,364,544 B1
(45) Date of Patent: Apr. 2, 2002

(54) AUTOMATIC DEVELOPING APPARATUS AND METHOD OF REPLENISHING REPLENISHER FOR DEVELOPER FOR SAID APPARATUSES

(75) Inventors: Hiroyuki Sasayama; Chikashi Oishi, both of Kanagawa (JP)

(73) Assignee: Fuji Photo Film Co., LTD, Kanagawa (JP)

( * ) Notice: Subject to any disclaimer, the term of this patent is extended or adjusted under 35 U.S.C. 154(b) by 0 days.

(21) Appl. No.: 09/772,956

(22) Filed: Jan. 31, 2001

(30) Foreign Application Priority Data

Jan. 31, 2000 (JP) ........................................ 2000-022306

(51) Int. Cl.[7] ........................... G03D 13/00; G03D 3/02
(52) U.S. Cl. ........................................ 396/578; 396/626
(58) Field of Search ................................ 396/578, 626, 396/620, 627; 430/30

(56) References Cited

U.S. PATENT DOCUMENTS 4,577,948 A * 3/1986 Lawson et al. ............. 396/626
4,882,246 A * 11/1989 Ohba et al. ................. 396/626
5,701,542 A * 12/1997 Sasyama .................... 396/578

FOREIGN PATENT DOCUMENTS

JP 64-21451 1/1989 ............. G03F/7/00
JP 02-96773 A * 4/1994

\* cited by examiner

Primary Examiner—D. Rutledge
(74) Attorney, Agent, or Firm—Sughrue Mion, PLLC

(57) ABSTRACT

In order to compensate the reduction of a developing activity during working and/or stopped period, a replenisher and/or a diluent is added to the developer according to predetermined replenishing conditions, and also in order to compensate the reduction of the developing activity caused by processing photosensitive materials, the replenisher and/or the diluent is added to the developer. Then, in cases where the electric conductivity of the thus replenished developer exceeds a predetermined target value, the diluent is replenished to the developer tank until the electric conductivity of the developer falls below the target value.

5 Claims, 3 Drawing Sheets

AUTOMATIC DEVELOPING APPARATUS AND METHOD OF REPLENISHING REPLENISHER FOR DEVELOPER FOR SAID APPARATUSES

BACKGROUND OF THE INVENTION

1. Field of the Invention

The present invention relates to an automatic developing apparatus for a photosensitive lithographic printing plate and to a method of replenishing a replenisher for developer for the apparatuses, and, in particular, to such a method as to minimize the fluctuation of developer sensitivity due to changes in developing conditions.

2. Description of the Related Art

In general, as a representative method of controlling the developer sensitivity in an automatic developing apparatus for photosensitive lithographic printing plates, there is adopted a method replenishing a replenisher for developer (hereinafter, just referred to as "replenisher") with time and processing, which replenishes the replenisher with time to a developer tank that a developer is stored, measures the plate area of the processed plates, and replenishes an amount of the replenisher corresponding to the measured value (hereinafter, referred to as "plate area-based replenishing method").

However, the plate area-based replenishing method requires a device for measuring a plate area of the lithographic plate in a developing part of the automatic developing apparatus, thus causing the structure of the developing apparatus complicated and expensive.

Further, it is difficult to judge whether a single surface or the both surfaces of the lithographic plate are processed, (hereinafter, referred to as "single surface/dual surface".) and the type of plate (note that there are various kinds of plates differing in coated amount of the photosensitive layer). Thus, in case that the appropriate replenisher amount will change depending on the plate area, the single surface/dual surface, and the type of plate, there is a problem that it makes difficult to appropriately replenish the replenisher.

On the other hand, there is conventionally disclosed in JP-A-64-21451 (the term "JP-A" as used herein means a Japanese Patent Unexamined Publication), a method replenishing the replenisher for an automatic developing apparatus for photosensitive lithographic printing plates, which measures the electric conductivity of the developer, compares the measured value with the calculated value that has been experimentally determined for the optimum sensitivity, and replenishes the replenisher in the case where the measured value is smaller than the calculated value. (Hereinafter, this method will be referred to as "conductivity-based replenishing method".)

The conductivity-based replenishing method can replenish the appropriate amount of the replenisher and can appropriately keep the developer sensitivity, even with the changes in plate area, single surface/dual surface, or type of lithographic plate to be processed.

However, it should be noted that the developer conductivity is affected (rises) by natural evaporation of water from the developer. Accordingly, when natural evaporation of water is promoted due to the affect of the installed conditions of the automatic developing apparatus or the like, an appropriate replenishing amount of the replenisher will be changed.

The aforementioned conductivity-based replenishing method cannot deal with the changes of the appropriate replenishing amount of the replenisher due to the natural evaporation of water. Thus, when the natural evaporation of water is increased, the appropriate replenishment is not realized, thus failing in keeping the developer sensitivity appropriately.

Moreover, the electric conductivity of the developer exhausted by carbon dioxide absorbed in elapsed time differs from that of the one exhausted by plate processing when the sensitivity of the two are recovered to their proper values. For example, a silicate-type processing agent exhibits 65 mS/cm when recovered from $CO_2$ fatigue in contrast to 55 mS/cm when recovered from plate processing, and a non-silicate-type processing agent exhibits 56 mS/cm when recovered from $CO_2$ fatigue in contrast to 39 mS/cm when recovered from plate processing. Therefore, if the frequency of processing, e.g., the processed amount per day changes, the electric conductivity for its optimal sensitivity tends to shift from the reference conductivity value set up in advance, thus it becomes impossible to keep the developer sensitivity appropriately.

SUMMARY OF THE INVENTION

By taking into account those situations described above, the object of the present invention is to provide an automatic developing apparatus and a method of replenishing the replenisher for said apparatuses, which can minimize the fluctuation of developing sensitivity against the changes in developing conditions, while using an economic and simple developing unit of the automatic developing apparatus, to thereby perform a stable development.

The purpose of the present invention can be achieved with the following apparatuses and methods.

(1) An automatic developing apparatus for photosensitive materials, includes:

- a developer tank storing a developer;
- a replenishing unit replenishing a predetermined amount of a replenisher for developer to maintain a developing activity of the developer in the developer tank;
- a memory for memorizing a first preset replenishing condition of the replenisher to compensate the reduction of the developing activity during working and/or stopped period, and a second preset replenishing condition of the replenisher to compensate the reduction of developing activity caused by the processing of the photosensitive materials;
- a calculating unit calculating a replenisher replacement ratio being a ratio that a charged solution of the developer is replaced by at least one of the replenisher and a diluent replenished for reducing an electric conductivity of the developer;
- an electric conductivity sensor measuring the electric conductivity of the developer; and
- a diluent replenishing unit replenishing the diluent to the developer tank until the electric conductivity becomes lower than an electric conductivity target value previously calculated from the replenisher replacement ratio, when the measured value of electric conductivity exceeds the target value.

(2) The automatic developing apparatus according to (1), wherein the electric conductivity target value is calculated from the replenisher replacement ratio, and one of the following values:

a) a dilution ratio of the sum of a diluent for diluting the replenisher and the diluent replenished for lowering the electric conductivity of the developer in the developer tank, relative to the replenisher, and b) a ratio of the integral amount of the replenisher which is replenished to compensate the reduction of the developing activity during working and/or stopping period, relative to the product of the replenisher replacement ratio with the amount of the developer.

(3) The automatic developing apparatus according to (1), wherein at least one of the developer tank and the automatic developing apparatus is structured to suppress air ventilation so that the $CO_2$ concentration of the air in a direct contact with the developer in the developer tank is kept below 300 ppm.

(4) A method of replenishing a replenisher for a developer in an automatic developing apparatus for photosensitive materials, includes the steps of:

a) replenishing a replenisher for developer based on a first predetermined replenishing condition so as to compensate the reduction of a developing activity during working and/or stopped period;

b) replenishing the replenisher based on a second predetermined replenishing condition so as to compensate the reduction of the developing activity caused by the processing of the photosensitive materials;

c) measuring an electric conductivity of the developer replenished with the replenisher in the steps a) and b); and d) replenishing a diluent into the developer until the electric conductivity of the developer falls below an electric conductivity target value predetermined by using a replenisher replacement ratio, when the measured value of the electric conductivity of the developer exceeds the target value.

(5) The method according to (4), wherein the electric conductivity target value is calculated from the replenisher replacement ratio, and one of the following values:

a) a dilution ratio of the sum of a diluent for diluting the replenisher and the diluent replenished for lowering the electric conductivity of the developer in the developer tank, relative to the replenisher, and b) a ratio of the integral amount of the replenisher which is replenished to compensate the reduction of the developing activity during working and/or stopping period, relative to the product of the replenisher replacement ratio with the amount of the developer.

In the present invention, the "replenisher for developer" represents a processing solution to be replenished for maintaining a constant developing performance. The replenisher for developer includes a solution regulated by diluting an undiluted replenisher with a diluent such as water, or a replenisher which can use without dilution as it is. Further, as to a replenishing method, the replenisher regulated by previously diluting the undiluted replenisher may be replenished to the developer tank, or the undiluted replenisher and the diluent may be directly replenished to the developer tank. In addition, when using the undiluted replenisher and the diluent, the integral amount of the replenisher is obtained by the sum of the undiluted replenisher and the diluent.

In the present invention, the electric conductivity of the developer can be measured with any device well known in the art, including an AC conductivity meter, an AC bridge meter and other types of conductivity meters.

In addition, although an optimal condition of a measured current value and an oscillating frequency or the like of the measuring device depends on compositions of the developer and the like, but from the viewpoints of device protection and preventing the electrolysis of the aqueous developer, it is preferable that the current value makes low to some extent, that is, from several hundred mA to several $\mu A$.

Further, from the viewpoints of the electrostatic capacity component of the developer, it is preferable that the frequency is from several hundred Hz to several hundred kHz.

The electric conductivity of the developer containing electrolytes depends on the temperature of the aqueous solution, and the electric conductivity decreases as the temperature rises. Hence, it is more preferable to measure the electric conductivity with a measuring device equipped with a temperature sensor and a temperature compensating circuit. Further, the controller for replenishment can compensate the temperature by converting an actually measured liquid resistance value and liquid temperature into the electric conductivity value at the predetermined temperature.

The sensor of the AC conductivity meter, the AC bridge meter, or other types of conductivity meters may be placed at any place where the sensor can be immersed in the developer at the measuring time and can measures its AC conductivity value of the developer. Preferably, the sensor can be placed inside the developer circulation system of the automatic developing apparatus, particularly, in the developer tank or in the circulation pipe.

As the detecting device, a well-known measuring cell containing electrodes made of platinum, stainless steel, or the like can be used.

Next, a description will be given of a developer and a replenisher applicable to the present invention.

1. Developer

Alkali Agent

The developer and the replenisher used in the present invention is aqueous alkaline solution with pH 9.0~13.5, and more preferably pH 10.0~13.3.

Conventionally known aqueous alkaline solutions can be used as such a developer or a replenisher. For example, inorganic base materials such as sodium or potassium silicate, trisodium, tripotassium or triammonium phosphate, disodium, dipotassium or diammonium hydrogenphosphate, sodium, potassium or ammonium bicarbonate, sodium, potassium or ammonium carbonate, sodium potassium or ammonium bicarbonate, sodium, potassium or ammonium borate, sodium, potassium, ammonium or lithium hydroxide, etc., and organic ones such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamide, diisopropanolamine, ethyleneimine, ethylenediamine, pyridine, etc. can be used.

Among these alkali agents, preferable ones are sodium and potassium silicate, because changing the ratio of silicon dioxide $SiO_2$ to alkaline metal oxide $M_2O$ both of which constitute these salts as well as the concentration can control the pH as well as the developing activity. In general, the silicate composition is expressed by the molar ratio of $SiO_2$ to $M_2O([SiO_2]/[M_2O])$. For example, an aqueous solution of potassium silicate having a molar ratio of $SiO_2$ to $M_2O$ of 0.5–2.0 (i.e., $[SiO_2]/[M_2O]=0.5–2.0$), and the content of $SiO_2$ in said solution being 1–4% by weight, is preferably used in the present invention.

Further, more preferable alkali agents used for the alkaline developer include those used for buffer solutions comprising a pair of weak acid and weak base. As weak acids used for such buffer solutions, those having an acid dissociation constant (pKa) of 10.0–13.3, more preferably 11.0–13.1, are suited. For example, sulfosalicylic acid having the third dissociation constant of 11.7 can be preferably used. Thus, polybasic acids at least one dissociation constant of which lies in the above-cited range can be applicable to the present invention.

Suitable weak acids can be chosen among those described in "Ionization constants of organic acids in aqueous solution" (Pergamon Press), etc., including, for example, alcohols such as 2,2,3,3-tetrafluoropropanol-1 (pKa=12.74), trifluoroethanol (12.37), trichloroethanol (12.24), etc., aldehydes such as pyridine-2-aldehyde (12.68), pyridine-4-aldehyde (12.05), etc., saccharides such as sorbitol (13.0), sucrose (12.7), 2-deoxyribose (12.61), 2-deoxyglucose (12.51), glucose (12.46), galactose (12.35), arabinose (12.34), xylose (12.29), fructose (12.27), ribose (12.22), mannose. (12.08), L-ascorbic acid (11.34), etc., compounds having one or more phenolic hydroxy groups such as salicylic acid (13.0), 3-hydroxy-2-naphthoic acid (12.84), catechol (12.6), gallic acid (12.4), sulfosalicylic acid (11.7), 3,4-dihydroxybenzenesulfonic acid (12.2), 3,4-dihydroxybenzoic acid (11.94), 1,2,4-trihydroxybenzene (11.82), hydroquinone (11.56), pyrogallol (11.34), resorcinol (11.27), etc., oximes such as 2-butanone oxime (12.45), acetoxime (12.42), 1,2-cycloheptanedionedioxime (12.3), 2-hydroxybenzadehyde oxime (12.10), dimethylglyoxime (11.9), ethanediamide dioxime (11.37), acetophenone oxime (11.35), etc., amino acids such as 2-quinolone (11.76), 2-pyridone (11.65), 4-quinolone (11.28), 4-pyridone (11.12), 5-aminovaleric acid (10.77), 2-mercaptoquinoline (10.25), 3-aminopropionic acid (10.24), etc., nucleic acid-related compounds such as fluorouracil (13.0), guanosine (12.6), uridine (12.6), adenosine (12.56), inosine (12.5), guanine (12.3), cytisine (12.2), cytosine (12.2), hypoxanthine (12.1), xanthine (11.9), etc., other weak acids such as diethylaminomethylphosphonic acid (12.32), 1-amino-3,3,3-trifluorobenzoic acid (12.29), isopropylidenediphosphonic acid(12.10), 1,1-ethylidenediphosphonic acid (11.54), 1,1-ethylidenediphosphonic acid-1-hydroxy (11.52), benzimidazole (12.86), thiozenzamide (12.8), pycolinethioamide (12.55), barbituric acid (12.5), etc.

Strong bases to be combined with the weak acids cited above include sodium, ammonium, potassium or lithium hydroxide.

Each of these bases can be used alone or in combination with each other.

Among the alkaline buffer agents mentioned above, preferable ones are the combinations of either of sulfosalicylic acid, salicylic acid, sucrose or sorbitol with sodium or potassium hydroxide. More preferable combinations comprise sorbitol and potassium or sodium hydroxide.

These alkali agents are used in such a manner as to realize preferable pH values by controlling their concentrations as well as combinations.

Surfactant

In the developer and the replenisher used in the present invention, various surfactants can be contained in order to promote development, disperse development scum, or to enforce the ink receptivity of the image area of the printing plate. Preferable surfactants include anionic, cationic, nonionic or amphoteric compounds.

Preferable examples of such surfactants include nonionic ones such as polyoxyethylene alkyl ethers, polyoxyethylene alkylphenyl ethers, polyoxyethylene polystyrylphenyl ethers, polyoxyethylene polyoxypropylenealkyl ethers, partial fatty acid esters of glycerin, partial fatty acid esters of sorbitan, partial fatty acid esters of pentaerithritol, mono- fatty acid esters of propylene glycol, partial fatty acid esters of sucrose, partial fatty acid esters of polyoxyethylene sorbitan, partial fatty acid esters of polyoxyethylene sorbitol, fatty acid esters of polyethylene glycol, partial fatty acid esters of polyglycerin, polyoxyethylene-added castor oil, partial fatty acid esters of polyoxyethylene glycerin, fatty acid diethanolamides, N,N-bis-2-hydroxyalkylamines, polyoxyethylene alkylamines, fatty acid esters of triethanolamine, trialkylamine oxide, etc.; anionic surfactants such as the salts of the following acids; fatty acid, abietic acid, hydroxyalkanesulfonic acid, alkanesulfonic acid, dialkylsulfosuccinic acid ester, straight and branched chain alkylbenzenesulfonic acid, alkylnaphthalenesulfonic acid, or alkylphenoxypolyoxyethylene propylsulfonic acid, polyoxyethylene alkylsulfophenyl ethersalt, sodium salt of N-methyl-N-oleyltaurine, bi-sodium salt of N-alkylsulfosuccinic acid monoamide, salts of petroleum sulfonic acid, sulfonated tallow, sulfate salts of fatty acid alkyl ester, alkylsulfate salts, polyoxyethylene alkyl ether sulfate salts, sulfate salts of fatty acid monoglyceride, polyoxyethylene alkylphenyl sulfate, poyoxyethylene styrylphenyl ether sulfate salts, alkylphosphate salts, polyoxyethylenealkyl ether phosphate salts, polyoxyethylene alkylphenyl ether phosphate salts, partially saponified styrene/maleic anhydride copolymers, partially saponified olefin/maleic anhydride copolymers, formaldehyde condensation products of naphthalenesulfonic acid salt, etc.; cationic surfactants such as quaternary ammonium e.g., alkylamine salts, tetrabutylammonium bromide, etc., polyoxyethylene alkylamine salts, polyethylene polyamine derivatives, etc.; amphoteric surfactants such as carboxybetaines, aminocarboxylic acids, sulfobetaines, aminosulfonic acid esters, imidazolines, etc. Among surfactants described above, "polyoxyethylene" group is replaceable to "polyoxyalkylene" including "polyoxymethylene", "polyoxypropylene", "polyoxybutylene", etc., and those having the replaced groups can also be included in the scope of the invention.

More preferable surfactants are fluorine-containing surfactants which include in their molecular structure a perfluoroalkyl group. Such surfactants include anionic ones such as perfluoroalkylcarboxylic acid salts, perfluoroalkylsulfonic acid salts, perfluoroalkylphosphoric acid esters, etc., amphoteric ones such as perfluoroalkylbetaine, etc., cationic ones such as perfluoroalkyltrimethylammnonium salts, etc., nonionic ones such as perfluoroalkylamine oxides, perfluoroalkylethylene oxide adducts, oligomers having perfluoroalkyl groups and hydrophilic groups, oligomers having perfluoroalkyl groups and oleophilic groups, oligomers having perfluoroalkyl groups, hydrophilic and oleophilic groups, urethanes having perfluoroalkyl groups and oleophilic groups, etc.

The surfactants described above can be used individually or in combination of two or more kinds of them in the concentration range of 0.001 to 10% by weight, or in a more preferable range of 0.01 to 5% by weight of the developer.

Development Stabilizing Agent

Various development stabilizing agents can be incorporated in the developer and the replenisher of the present invention, including polyethylene glycol adducts of sucrose alcohol disclosed in JP-A-6-282079, tetraalkylammonium salts such as tetrabutylammonium hydroxide, etc. phosphonium salts such as tetrabutylphosphonium bromide, etc, and iodonium salts such as diphenyliodonium chloride, etc.

Further, the anionic or the amphoteric surfactants disclosed in JP-A-55-51324, the water soluble cationic polymers disclosed in JP-A-55-95946, and the amphoteric polymer electrolytes disclosed in JP-A-56-142528 can be used.

Moreover, alkylene glycol-added organic boron compounds disclosed in JP-A-59-84241, water soluble surfactants comprising polyoxyethylene/polyoxypropylene block type disclosed in JP-A-60-111246, alkylenediamines substituted with polyoxyethylene polyoxypropylene disclosed in JP-A-60-129750, polyethylene glycol having weight-averaged molecular weight of not less than 300 disclosed in JP-A-61-215554, fluorine-containing surfactants having a cationic group disclosed in JP-A-63-175858, the water soluble ethylene oxide-added compounds obtained by adding 4 or more moles of ethylene oxide to acids or alcohols disclosed in JP-A-2-39157, water soluble polyalkylene compounds, etc.

Organic Solvent

If needed, organic solvents can be added to the developer and the replenisher of the present invention. Suitable organic solvents should have a solubility to water of 10% by weight or less, more preferable 5% by weight or less. Examples of such solvents include 1- and 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-, 3- and 4-methylcyclohexanol, N-phenylethanolamine, N-phenyldiethanolamine, etc. A suitable range for the content of such organic solvents is from 0.1 to 5% by weight of the total amount of the working solution. The content has a close relation to the amount of the surfactant in use; with the increase of organic solvent, the amount of surfactant should preferably be increased. When only a small amount of surfactant is used in the presence of a large amount of organic solvent, the organic solvent will sometimes not be perfectly dissolved in the composition, thus failing in securing a desirable level of developing capability.

Reducing Agent

The developer and replenisher compositions of the present invention can further contain reducing agents in order to prevent lithographic printing plates from staining. Reducing agents are particularly effective for the development of negative-working photosensitive lithographic printing plates containing photosensitive diazonium salt compounds. Particularly preferred organic reducing agents include phenolic compounds such as thiosalicylic acid, hydroquinone, Methol (N-methylaminophenol), methoxyquinone, resorsine, 2-methylresorsine, etc. amine compounds such as phenylenediamine, phenylhydrazine, etc. Particularly preferred inorganic reducing agents include the sodium, potassium and ammonium salts of inorganic acid such as sulfurous, hydrogensulfurous, phosphorous, monohydrogenphosphorous, dihydrogenphosphorous, thiosulfuric, dithionous acid, etc. Among these reducing agents, the most preferable one is sulfite salts. The preferable range for the content of the reducing agent is from 0.05 to 5% by weight of the working developer.

Organic Carboxylic Acid

The developer and replenisher compositions of the present invention can further contain organic carboxylic acids. Preferable acids are aliphatic and aromatic carboxylic acids with 6–20 carbon atoms. Preferable aliphatic acids include caproic, enanthic, capryl, lauric, myristic, palmitic, stearic acids, etc., particularly suitable ones being $C_{8-12}$ alkanoic acids. Unsaturated fatty acids containing double bonds in their carbon chain can be used. Branched chain fatty acids can also be used.

Suitable aromatic carboxylic acids are those comprising benzene ring, naphthalene ring, anthracene ring substituted with a carboxyl group, exemplified by o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1- and 2-naphthoic acid, etc. Among these, hydroxynaphthoic acid is one of the most suitable aromatic acids.

The above described aliphatic and aromatic carboxylic acids can be preferably used in the form of sodium, potassium or ammonium salt to secure a high solubility to water. There is no special limitation on the content of organic carboxylic acid in the developer composition of the present invention, but, in general, contents below 0.1% by weight cannot exert a sufficient effect; on the other hand, when the acid content exceeds 10% by weight, the effect is saturated, and tends to hinder the solution of other additives. Accordingly, the practical range lies between 0.1 and 10% and more preferably 0.5 and 4% by weight of the working developer.

Antiseptic

Antiseptics can be added to the developer, washing water or finishing liquid. Known antiseptics for fabric, wood processing, food, cosmetic, agricultural chemical, etc. can be used. Examples include quaternary ammonium salts, monovalent, bivalent or polyvalent phenol derivatives, imidazole derivatives, pyrazolopyrimidine derivatives, monovalent naphthol, carbonates, sulfone derivatives, organic tin compound, cyclopentane derivatives, phenyl derivatives, phenol ether derivatives, phenol ester derivatives, hydroxylamine derivatives, nitrile derivatives, naphthalines, pyrrole derivatives, quinoline derivatives, benzothiazole derivatives, secondary amines, 1,3,5-triazine derivatives, thiadiazole derivatives, anilide derivatives, pyrrole derivatives, halogen derivatives, dihydric alcohol derivatives, dithiols, cyanic acid derivatives, thiocarbamide derivatives, diamine derivatives, isothiazole derivatives, monohydric alcohols, saturated aldehydes, unsaturated monocarboxylic acids, saturated and unsaturated ethers, lactones, amino acid derivatives, hydantoins, cyanuric acid derivatives, guanidine derivatives, pyridine derivatives, saturated monocarboxylic acids, benzenecarboxylic acid derivatives, hydroxycarboxylic acid derivatives, biphenyl, hydroxamic acid derivatives, aromatic alcohols, halogenophenol derivatives, benzenecarboxylic acid derivatives, mercaptocarboxylic acid derivatives, quaternary ammonium salt derivatives, triphenylmethane derivatives, hinokitiol, furan and benzofuran derivatives, acridine derivatives, isoquinoline derivatives, arsine derivatives, thiocarbamic acid derivatives, phosphoric acid esters, halogenated benzene derivatives, quinone derivatives, benzenesulfonic acid derivatives, monoamine derivatives, organic phosphoric acid esters, piperadine derivatives, phenazine derivative, pyrimidine derivatives, thiophanate derivatives, imidazoline derivatives, isoxazole derivatives, ammonium salt derivatives, et. Particularly suited anticeptics are the salts of pyridinethiol-1-oxide, salicylic acid and its salts, 1,3,5-trishydroxyethylhexahydro-S-triazine, 1,3,5- trishydroxymethylhexahydro-S-triazine, 1,2-benzisothiazoline-3-one, 5-chloro-2-methyl-4-isothiazoline-3-one and 2-bromo-2-nitro-1,3-propanediol. The addition levels of these antiseptics are determined so as for the antiseptics to work in a stable and effective manner against bacteria, mold, yeast fungi, etc., depending on the kinds of bacteria, etc. A preferable range is usually 0.01–4% by weight. In general, combined two or more kinds of antiseptics are preferably used together to protect the developer from various kinds of bacteria, mold, etc.

Other Ingredients

The developer and replenisher compositions used in the present invention can further contain still other ingredients such as anti-forming agent, water softener, etc., depending on the need. Softeners for hard water include, for example, polyphosphoric acid and its sodium, potassium or ammonium salt, amino-polycarboxylic acid such as ethylenediaminetetraacetic acid, diethylenetriaminepentaacetic acid, triethylenetetraminehexaacetic acid, hydroxyethylethylenediaminetriacetic acid, nitrylotriacetic acid, 1,2-diaminocyclohexanetetraacetic acid, 1,3-diamino-2-propanol tetraacetic acid, etc., sodium, potassium or ammonium salt of the amino-polycarboxylic acids described above, aminotri(methylene phosphonic acid), ethylenediamine-tetra(methylene phosphonic acid), diethylenetriaminepenta(methylene phosphonic acid), triethylenetetraminehexa(methylene phosphonic acid), hydroxyethylethylene-diaminetri(methylene phosphonic acid) and 1-hydroxyethane-1,1-diphosphonic acid and sodium, potassium or ammonium salt of the phosphonic acids cited above.

A preferable range for the concentration of such a softener depends on its chelating capability as well as the hardness of the water in concern; generally speaking, based on the working developer, 0.01–5% by weight and more preferably 0.01–0.5% by weight is recommended. Lower concentration levels than the described range fail to exert a sufficient softening effect; on the other hand, higher addition levels tend to have adverse effects on developed images such as density drop, etc.

The remaining part of the developer and the replenisher consists of water, to which still various additives known in the art can be added.

From the viewpoint of the transportation, the developer and the replenisher of the present invention take a condensed form in which they have an increased concentration of ingredients to be diluted with water in use. The degree of condensation is determined so as to cause neither phase separation nor deposition of the ingredients. The temperature of the developer should be kept at 15–40° C., and more preferably 20–35° C. The developing time is preferably 5–60 sec, and more preferably 7–40 sec.

The method of the invention can be applied not only to the above-cited developers, but also to those described in EP0836120A1, EP0908785A, EP0908306A, EP0914941A1, JP-A-11-327163 and JP-A-11-327160 and Japanese Patent Application No. 2000-255670.

Next, photosensitive lithographic printing plates used in the present invention will be described.

A type of positive-working image recording material is proposed in JP-A-7-285275, JP-A-11-119419 and Japanese Patent Application 11-182751 in which the material can record images via an infrared laser exposure. The photosensitive material consists of a binding agent such as cresol resin, a substance that generates heat by absorbing light, and another substance that is thermally decomposable such as quinonnediazide and which substantially prevents said binding agent from dissolving in the developer when not decomposed. In such a positive-working material, at exposed areas, the substance generating head by absorbing light generates head, thus causing the exposed areas to dissolve.

Furthermore, JP-A-7-20625, JP-A-11-218903, Japanese patent application Nos. 11-308286 and 11-332936 disclose a type of negative-working image recording material comprising a compound that generates acid upon the decomposition by light or heat, a cross-linking agent that works by the presence of acid, at least one kind of alkali-soluble resin, and an infrared light absorbing agent. In such a negative-working image recording material, at exposed areas, the substance generates heat by absorbing light, the above compound generates acid by decomposing by the heat, and the acid thus formed promotes the cross-linking of the alkali-soluble resin with the cross-linking agent, to thereby perform an image recording.

The present invention can use such image recording materials described above as a lithographic printing plate. To form lithographic printing plates, the image recording on lithographic printing plates is performed by an infrared laser exposure, which are subjected to heat treatment, if needed, and then to perform a development proceeding.

The present invention is also applicable to the processing of the photosensitive lithographic printing plates based on the photopolymer compositions as disclosed in Japanese Patent Application Hei.10-251521, JP-A-2000-39724 and Japanese Patent Application 2000-276811. The photosensitive lithographic printing plates based on the photopolymer compositions consist of, on a substrate that an aluminum plate is subjected to a hydrophilic proceeding, a photopolymerizable layer containing a compound having an ethylenic double bond capable of addition polymerization and a polymer having a cross-linkable group in its side chain. In the present invention, such a type of lithographic plate is exposed imagewise with laser light and then is developed.

The present invention is also applicable to the processing of the positive-working photosensitive lithographic printing plates disclosed in JP-A-9-274324, JP-A-2000-231188 and Japanese Patent Application No.2000-13656, having been in a wide use in the conventional art. This type of lithographic plate consists of an aluminum plate as a support body on which a photosensitive layer containing an o-quinonediazide compound. O-quinonediazide compounds are known to be converted to carboxylic acids by UV exposure, thus the layer can be developed with an aqueous alkaline solution to cause a removal of the exposed areas of the photosensitive layer, whereby the support body surface is exposed. The exposed support surface of the aluminum support body, which is hydrophilic, at the exposed (non-image portion) areas holds water by the development and repels oil based ink on the printer. On the other hand, the image areas where the photosensitive layer remains accept oil based ink and repels water. Usually, in the photosensitive layer of such positive-working type lithographic plates is incorporated a cresol-novolac resin as the binder for the o-quinonediazide compound. The method of the present invention is applicable to the proceeding of the negative-working photosensitive lithographic plate, which is disclosed in JP-A-7-295212 and Japanese Patent Application No. 2000-103135.

DETAILED DESCRIPTION OF THE PREFERRED EMBODIMENT

A description will be given of some practical embodiments of the present invention with reference to the attached figures.

Figure 1:
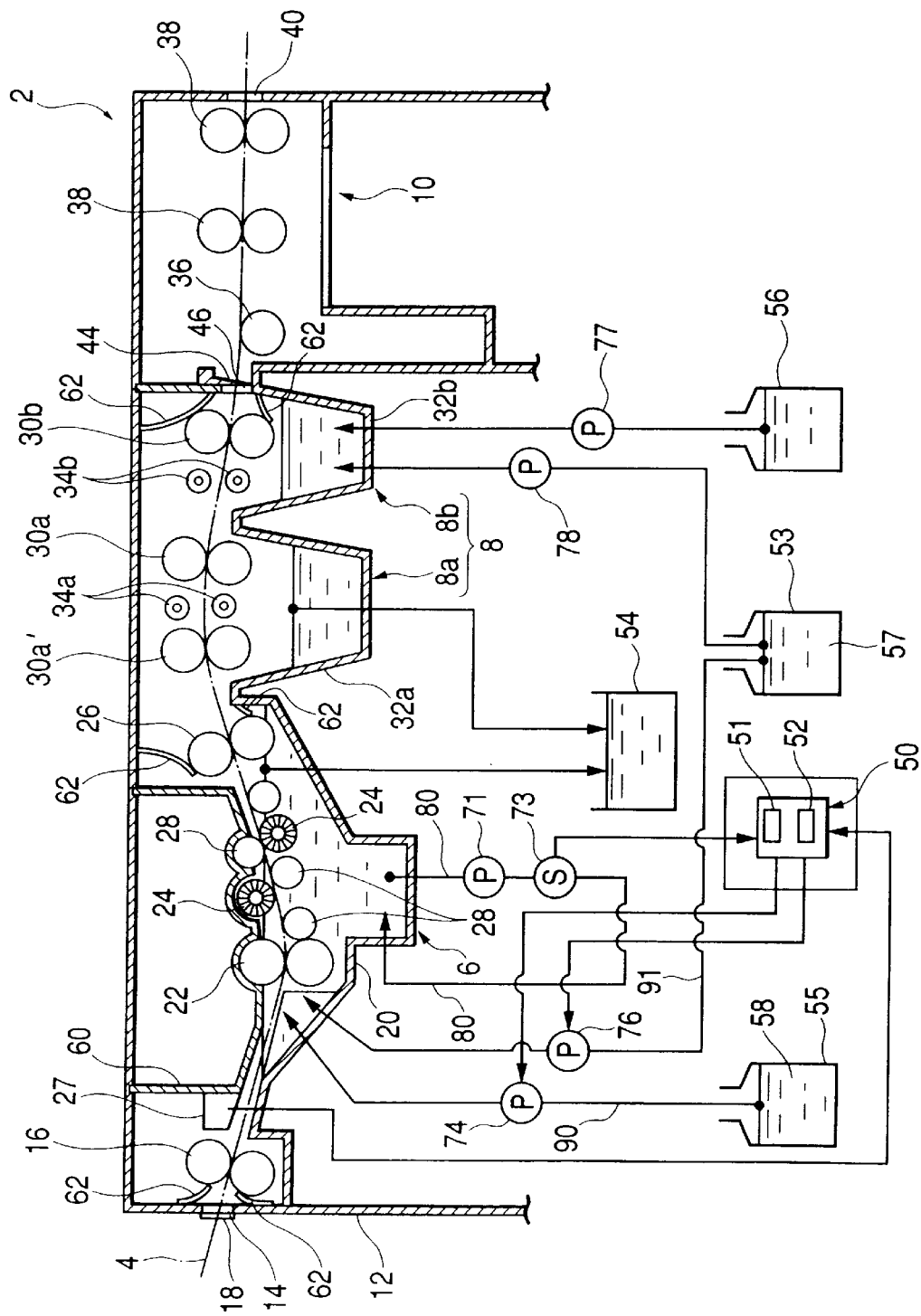
FIG. 1 is a view showing a structure of the automatic developing apparatus according to a first embodiment of the present invention.

As shown in FIG. 1, an automatic developing apparatus 2 includes a developing unit 6 which develops photosensitive lithographic printing plates (hereinafter, referred to as "PS plates") 4, a finishing unit 8 which first washes off the developer adhered to the developed PS plate 4 and which then coats a gum solution thereon, and a drying unit 10 which dries the PS plate coated with the gum solution.

When the PS plate 4 that requires pre-heating prior to development are processed, a pre-heating unit (not shown in FIG. 1) can be provided. The pre-heating unit is arranged at the upstream side of the developing unit 6 along the transport direction, and has a function of keeping the surface temperature of the PS plate 4 during a predetermined period while the PS plate 4 is transported. The PS plate 4 inserted into the pre-heating unit is automatically transported along with the application of heat toward the next processing.

Further, the developing apparatus 2 may include a pre-washing unit (not shown in FIG. 1). The pre-washing unit is arranged at the upstream side of the developing unit 6 and at the downstream side of the pre-heating unit along the transport direction. The pre-washing unit has a function of washing and cooling the surface of the PS plate 4 by washing water while transporting the PS plate 4. The PS plate 4 inserted into the pre-washing unit is transported towards the developing unit 6 that carries out the next processing.

An insert port 14 is formed in a sidewall 12 of the automatic developing apparatus 2, and the PS plate 4 inserted from the insert port 14 is sent to the developing unit 6 by transport rollers 16. At the insert port 14, there is provided a rubber blade 18 that closes the insert port 14 except when a PS plate 4 is being inserted.

In a developer tank 20 of the developing unit 6, transport rollers 22, brush rollers 24 and squeeze rollers 26 are equipped in this order from the upstream side in the transporting direction, and backup rollers 28 are also equipped between the former three rollers in an appropriate manner. The PS plate 4 is immersed in and developed by the developer solution while being transported by the transport roller 22.

The finishing unit 8 contiguous to the developing unit 6 includes a first finishing unit 8a and a second finishing unit 8b. Each of these finishing units 8a, 8b is equipped with transport rollers 30a, 30b transporting the PS plate 4, nozzles 34a, 34b that spray the gum solution stored in finishing tank 32a, 32b onto the PS plate 4. The PS plate 4 after the development is coated with the gum solution by the nozzles 34a, 34b while being transported by the transport rollers 30a, 30b. The gum solution stored in the second finishing tank 32b of the second finishing unit 8b located at the downstream side is overflowed to be supplied to the first finishing tank 32a of the first finishing unit 8a. In stead of this structure, the gum solution may be supplied from the second finishing tank 32b to the first finishing tank 32a with using a pump or the like.

The drying unit 10 contiguous to the finishing unit 8 is equipped with a guide roller 36 and a pair of rollers with skewers 38 in this order from the upstream side in the transporting direction. In the drying unit 10, there is equipped a drying device such as a warm-air supplying unit, a heating unit, etc. not shown in the figure. In the drying unit 10 there is a discharge port 40, through which the dried PS plate 4 is discharged out of the apparatus. Further, a shutter 44 is provided in a passage 46 between the drying unit 10 and the finishing unit 8, and the shutter 44 is kept the passage 46 closed except when the PS plate 4 is moving along the passage 46.

To the second finishing tank 32b, the gum solution stored in a gum solution tank 56 is fed by a pump 77, and a diluent (water) 57 stored in a diluent for replenishment storage tank 53 is also fed by a diluent for replenishment supplying pump 78. Here, the replenishing amount of the gum solution to that of the diluent is 1:1. Along with such replenishment, the gum waste solution overflowed from the first finisher tank 32a is collected to the waste tank 54 as well as the developer waste solution.

In a developer tank 20, a box-shaped shielding cover 60 is provided integrally with the tank walls. The bottom wall of the shielding cover 60 is structured to have plural curved depressions so as not to touch with upper circumferential surfaces of the rollers 22, 24 and 28.

As the shielding cover 60 is of box-shape, an airtight space is formed above the developer tank 20, and thus the amount of air in the developing unit 6 is minimized. Further, owing to the presence of the shielding cover 60, the area of the developer directly contacted with the air is made as small as possible.

In the automatic developing apparatus 2 described heretofore, plural rubber blades 62 are provided at proper places in such a manner that a substantially airtight space is formed from the developing unit 6 to the second finishing unit 8b by preventing the external atmosphere from entering inside. The space between the developing unit 6 and the first finishing unit 8a is also airtightly formed by the rubber blade 62 so as to prevent the air in first finisher 8a from flowing into the developing unit 6. Thus, the developing unit 6 is substantially airtight except the period of the passage of the PS plate 4 through the insert port, which the air is slightly entered.

Now, the developing unit 6 will be described more in detail. To the developer tank 20 is connected a circulation pipe 80 of the developer, in which are installed a developer circulation pump 71, a conductivity sensor 73 and a filter (not shown).

The developer circulation pump 71 sucks the developer in the tank 20 through the hole provided in the bottom of the tank 20 into the pipe 80, puts the developer into circulation, and again ejects the developer back into the tank 20. The filter filters the developer flowing through the pipe 80. The conductivity sensor 73 measures the conductivity of the developer passing through the pipe 80.

Moreover, the developing unit 6 is equipped with a replenishing device comprising replenishing pipes 90 and 91, an undiluted replenisher storage tank 55 connected to the replenishing pipe 90, an undiluted replenisher supplying pump 74 intervened in the replenishing pipe 90, the diluent for replenishment storage tank 53 connected to the replenishing pipe 91, and a diluent for replenishment supplying pipe 76 intervened in the replenishing pipe 91. The developing waste solution which overflows the developer tank 20 is collected in the waste tank 54.

Specifically, close to the developer tank 20 are provided the pair of pipes 90 and 91 that supply the replenisher obtained by diluting the undiluted replenisher 58 with the diluent for replenishment 57. The replenishing pipe 90 for the undiluted replenisher 58 is connected to the undiluted replenisher storage tank 55 (at the bottom left in FIG. 1). The undiluted replenisher supplying pump 74 is involved in the pipe 90, and supplies the undiluted replenisher 58 from the undiluted replenisher storage tank 55 to the developer tank 20.

The replenishing pipe 91 for the diluent for replenishment 57 is connected to the diluent storage tank 53 (at the bottom middle in FIG. 1). The diluent supplying pump 76 is involved in the replenishing pipe 91, and supplies the diluent for replenishment (water) 57 from the diluent storage tank 53 to the developer tank 20. In other words, the replenishing pipe 91, the diluent for replenishment supplying pump 76 and the diluent storage tank 53 constitute a diluent supplying system.

Both of the undiluted replenisher supplying pump 74 and the diluent for replenishment supplying pump 76 are controlled by a controlling ROM 51 being a condition memorizing unit and a controller 50 comprising a time measuring device 52, wherein the former 74 is controlled based on signals from a plate detector 27 and a time measuring device 52 while the latter 76 is controlled based on signals from the plate detector 27, the time measuring device 52 and the conductivity sensor 73.

The controller 50 controls the undiluted replenisher supplying pump 74 and the diluent supplying pump 76 based on the signals from the plate detector 27 which can judge whether a plate is being processed or not and which can measure the area, etc. of the transported plate, and carries out the replenishment referring to the replenishing conditions established according to the actual operating conditions of the automatic developing apparatus 2 and memorized in the controlling ROM 51. Thus, as an example, the controller 50 supplies the amount of the replenisher for developer (the sum of the undiluted replenisher 58 and the diluent for replenishment 57) corresponding to the replenishing condition from the undiluted replenisher storage tank 55 and the diluent for replenishment storage tank 53 after processing every plate. Alternatively, the replenishment may be performed after processing a fixed plural number of plates, not every plate.

Further, the controller 50 carries out the replenishment when the time measuring device 52 detects the elapse of a predetermined time, referring to the replenishing conditions established according to the actual operating conditions of automatic developing apparatus 2. The controller 50 supplies the amount of the replenisher for developer (the sum of undiluted replenisher 58 and the diluent for replenishment 57) corresponding to the replenishing condition memorized in the controlling ROM 51 from the undiluted replenisher storage tank 55 and the diluent storage tank 53 coping with the effect of time elapse.

Further, when the conductivity of the replenished developer measured by the sensor 73 exceeds the target value (corresponding to the desirable state of the developer) calculated from the replacement ratio of the replenisher, etc., the controller 50 supplies the diluent for replenishment 57 to developer tank 20 from the diluent storage tank 53.

Next, a description will be given of an operation of the present embodiment.

During the operation of the automatic developing apparatus 2, the undiluted replenisher supplying pump 74 and the diluent for replenishment supplying pump 76 are controlled by the controller 50 on the basis of the signals from the time measuring device 52 and the plate detector 27 with reference to the predetermined replenishing conditions depending on actual operating conditions, whereby the replenisher is supplied to the developer tank 20 by the two pumps to compensate the effects of time elapse as well as processing.

Further, by controlling the diluent supplying pump 76 by the controller 50 based on the signals from the conductivity sensor 73, the diluent is replenished to the developer tank 20 from the diluent storage tank 53 until the conductivity of the developer replenished with the replenisher becomes below the predetermined target value.

A description will be given of a control of the controller 50 with reference to FIG. 2.

First of all, at step S1, the replenishment of the replenisher is carried out with a lapse of time and at every processing in the predetermined condition, based on the replenishing conditions (memorized in controlling ROM 51) predetermined depending on the actual operating conditions of the automatic developing apparatus 2.

Then, at step S2, the target value of conductivity is calculated from the replacement ratio of the replenisher defined by a ratio that the charged developer at the start of the developing processing is replaced with the replenisher and/or the diluent replenished to lower the conductivity of the developer.

The mathematical formulae for the calculation of the target conductivity value are as follows. By using various values defined as follows;

Vt: the volume of the developer present in the developer tank,

Vwi: the volume of the diluent for diluting the replenisher replenished to compensate the fatigue caused by aging and/or by plate processing, and/or the volume of the diluent replenished to lower the conductivity of the developer, Vhi: the volume of the undiluted replenisher replenished to compensate the fatigue caused by aging and/or by plate processing, Vhc: the volume of the replenisher added to compensate the fatigue caused by aging, Vhd: the volume of the replenisher replenished to compensate the fatigue caused by plate processing, $X_n$: the replacement ratio of the replenisher, $Z_n$: the replenisher dilution ratio being a ratio that the diluent for replenishment and/or the diluent replenished to lower the developer conductivity is included in the replenisher present in the developer, $F_n$: aging replenisher ratio being a ratio of the replenisher replenished to compensate the aging-caused fatigue, to the replenisher present in the developer, D: the target conductivity value, and $C_1$, $C_2$, $C_3$, $C_4$, $C_5$, $C_6$, $C_7$, $C_8$ and $C_9$: experimentally determined constants proper to the developer (proceeding solution) and the apparatus, then $X_n = (Vt \cdot X_{n-1} + Vhi + Vwi)/(Vt + Vhi + Vwi)$ $Z_n = [Vt \cdot X_n \cdot Z_{n-1} + Vwi \cdot (Z_{n-1}+1)]/[Vt \cdot X_n + Vhi \cdot (Z_{n-1}+1)]$ $D = (1-X_n) \cdot C_3 + X_n \cdot [[1-(C_5+C_4/(Z_n+1))] \cdot C_6 + [C_5+C_4/(Z_n+1)]C_9]$ or $F_n = [Vt \cdot X_n \cdot [C_2+C_1/(Z_n+1)] \cdot F_{n-1} + Vhc]/[Vt \cdot X_n \cdot [C_2+C_1/(Z_n+1)] + Vhc + Vhd]$ $D = (1-X_n) \cdot C_3 + X_n \cdot [[1-(C_5+C_4/(Z_n+1))]C_6 + (C_5+C_4/(Z_n+1)) \cdot [(1-F_n) \cdot C_7 + F_n \cdot C_8]]$.

At step S3, the conductivity sensor 73 measures the conductivity of the developer with a lapse of a fixed time.

At step S4, the target conductivity value obtained at S2 is compared with the measured conductivity value obtained at S4.

When the measured value exceeds the target value at S4, a necessary amount of the diluent is replenished to the developer at step S5, then the operation returns to S1.

On the other hand, when the measured value is below the target value at S4, the operation returns to S1 without replenishing the diluent to the developer.

Figure 3:
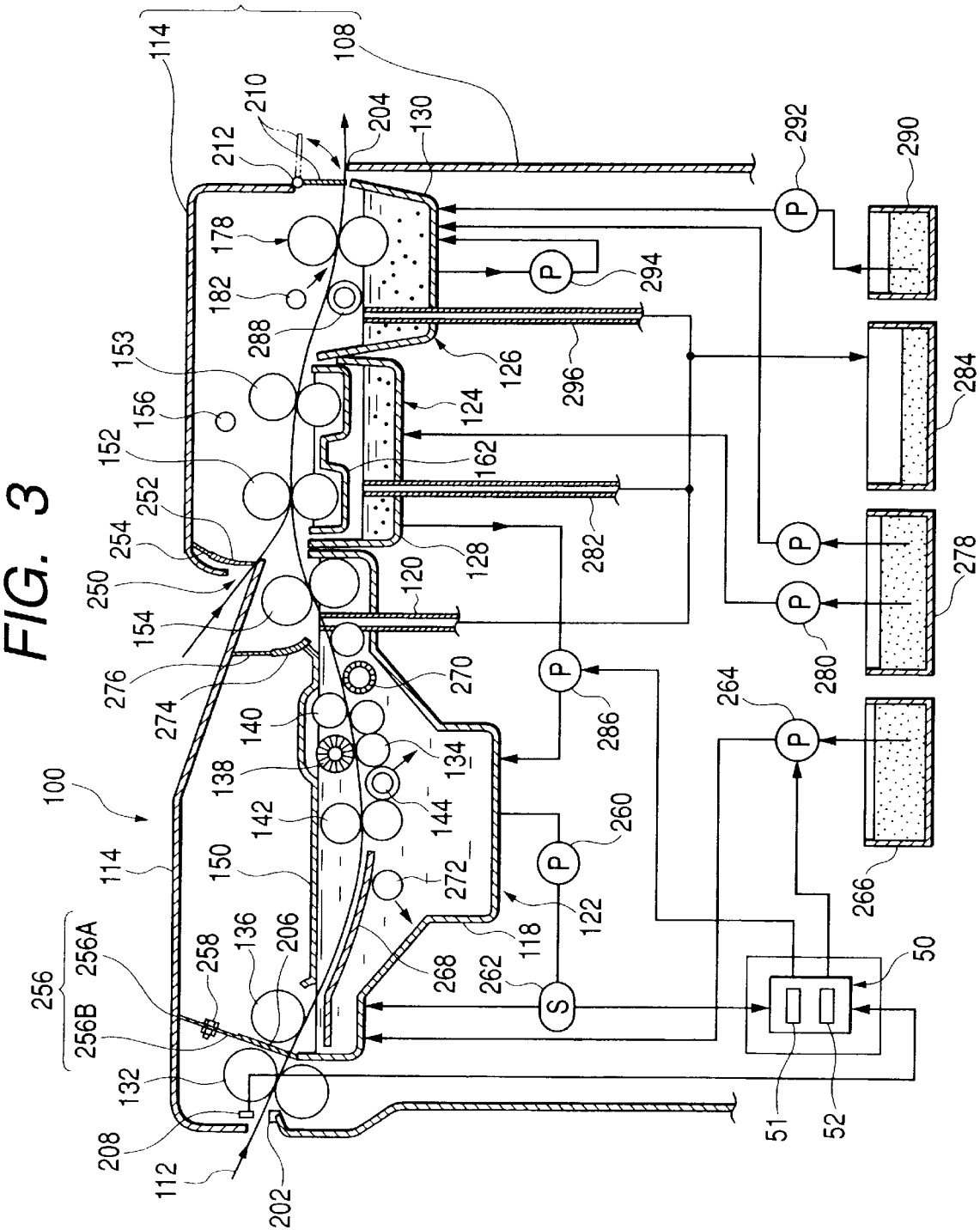
FIG. 3 is a view showing a structure of the automatic developing apparatus according to a second embodiment of the present invention.

Now, a second embodiment of the present invention will be explained. FIG. 3 shows the structure of the automatic developing apparatus of the second embodiment of the invention.

In an automatic developing apparatus 100 of the present embodiment, processing units inside thereof are covered with outer panels 114. Inside of the outer panels 114, there are arranged a developing unit 122 including a developer tank 118 for developing a PS plate 112 and an overflow pipe 120 which collects the developer overflowed from the developer tank 118, a water washing unit 124 which washes off the developer adhered to the PS plate 112 and a finishing unit 126 which desensitizes the washed PS plate 112 by coating a gum solution. The washing unit 124 has a washing water tank 128, and the finishing unit 126 has a gum solution tank 130.

In the outer panel 114, there are provided a slit-shaped insert port 202 and a slit-shaped discharge port 204. In the upper plane of panel 114, there is provided an insert port for reentry 250 (sub insert port) for the insertion of the PS plate 112 between the developing unit 122 and the washing unit 124. This sub insert port 250 is used to perform the other processing than development on the PS plate 112.

At the sub insert port 250, there is a blade 252, the leading edge of which is in contact with the outer panel 114 acting as a guiding support surface for the sub insert port 250. On the other hand, the base portion of the blade 252 is fixed to the rear side of outer panel 114 through an intervening bracket 254. With such a structure, the sub insert port 250 is usually kept in a closed state by the blade 252.

The drying unit (not shown) dries the PS plate 112 by blowing a warm air to the both surfaces thereof while transporting by plural rollers (not shown) the PS plate 112 sent from finishing unit 126.

A pair of transport rollers 132 are equipped at the insertion side of the PS plate 112 to the developer tank 118 in the developing unit 122. The PS plate 112 is inserted from the insert port 202 between the pair of transport rollers 132.

A rubber blade 206 is provided at the downstream side of and close to the transport roller 132. The leading edge of the blade 206 is in contact with the sidewall of the developer tank 118 of the developing unit 122, and its base portion is attached to the outer panel 114 through a bracket 256. The bracket 256 includes a fixed part 256A and sliding part 256B attached to the fixed part 256A with a wing nut 258, and the blade 206 is fixed to the sliding part 256B. Thus, the blade 206 is so constructed that its leading edge can be separated from the sidewall of the developer tank 118 by moving the sliding part 256B relative to the fixed part 256A with the wing nut 258 loosened.

Further, in the vicinity of the insert port 102, a plate detector 208 is equipped which detects whether the PS plate 112 is passing or not and which also can measure the area of the plate, etc.

The developer tank 118 has a cross-sectional shape of a substantially inverted mountain, the top of the tank 118 is open and the center portion of the bottom thereof protrudes downward. The tank 118 has a pump 260 that sucks the developer in the tank 118 and blows out it from spray pipes 144 and 272 that will be described later, whereby the developer stored in the developer tank 118 is circulated. During the circulation, the flowing developer passes through a conductivity sensor 262 which measures a conductivity of the developer. Further, the undiluted replenisher is supplied from an undiluted replenisher storage tank 266 to developer tank 118 by a pump 264. As will be described later, a diluting water is also supplied from the water tank 128 to the developer tank 118 by a pump 286.

Both of the pumps 264 and 286 are controlled by the controller 50 comprising the controlling ROM 51 being a condition memorizing unit and a time measuring device 52 whereby the former 264 is controlled based on signals from the plate detector 208 and the time measuring device 52, while the latter 286 is controlled based on signals from the plate detector 208, the time measuring device 52 and the conductivity sensor 262. Detailed descriptions on the operations and effects of the controller 50 which are similar to those in the first embodiment are omitted.

In the developer tank 118, there are arranged a guide plate 268 in the upstream side, and plural guide rollers 134 and a rotary brush roller 270 in the downstream side. These guide rollers 134 and rotary brush roller 270 are bridged over the pair of the sidewalls of the tank 118 in a revolvable manner.

A guide roller 136 of a relatively large diameter is arranged above the guide plate 268, and rotary brush rollers 138 and 270, and guide roller 140 are arranged above the guide roller 134. In the center portion of the tank 118, a pair of squeeze rollers 142 is provided which squeezes the surface of the PS plate 112.

The overflow pipe 120 is arranged at the most downstream side of tank 118. The overflow pipe 120 conducts the developer to a waste tank 284 when the liquid surface of the developer exceeds a predetermined level.

A liquid cover is disposed on the surface of the developer in the developer tank 118. The liquid cover 150 has an arc-shaped projected part corresponding to the brush roller 138 and the guide roller 140 contiguous to the roller 138. The cover 150 is contacted with the liquid surface of the developer to prevent the developer from being directly contacted with air, and is slidably held at its both edges along the transport direction of the PS plate 112 by the sidewalls (not shown) in such a manner as to permit a vertical motion of the cover in accordance with changes of the level of the liquid surface.

The downstream end of the liquid cover 150 along the transport direction is in contact with the leading edge of a blade 274 that is fixed to the outer panel 114 via a bracket 276. With the blade 274 thus structured, the liquid surface of the developer exposed at the downstream end of the liquid cover 150 in the transport direction is separated from the upper portion of the liquid cover 150. Further, by the blade 206 in the vicinity of the insert port 202, the upper space of the liquid cover 150 is perfectly separated from the external atmosphere, to thereby prevent the evaporation of the developer. Note that each side end of the blade 206 is in a tight contact with the sidewall of developer tank 118.

At the most downstream side of the developer tank 118, a pair of rollers 154 are arranged which holds and transports the PS plate 112 while simultaneously squeezing the developer from the surface of the PS plate 112.

The automatic developing apparatus 100 has the water washing tank 128 of the water washing unit 124 at the downstream side of the developing unit 122. Above the water washing tank 128, two pairs of transport rollers 152 and 153 are placed.

The washing water tank 128 stores washing water used to remove the developer from the PS plate 112 fed from the developer tank 118. A spray pipe 156 is provided at the upstream side of the top transport roller 153 and above the transport passage. The outer surface of the pipe 156 has plural discharge holes communicating with the inside of the pipe 156. The washing water dipped by the pump 280 from the tank 278 is dropped from the spray pipe 156 on the top roller of the transport rollers 153. With the rotation of the top roller 153, the washing water readily spreads on and thus effectively cleans the surface of plate 112.

The lower portion of the bottom transport roller 152 or 153 is immersed in the washing water stored in a pan 162. The bottom roller pulls up the washing water so as to clean the rear surface of plate 112, and prevent the dry-up of the top roller 152 or 153.

The washing water spread laterally along the front surface of plate 112 falls into the pan 162 from the both side edges of the PS plate 112, and the washing water scooped up from the pan 162 washes the rear surface of the PS plate 112. The water overflowed from pan 162 is conducted to the water washing tank 128, in which an overflow pipe 282 is equipped so as to collect the washing water of the volume exceeding the predetermined liquid level to the waste tank 284.

The washing water tank 128 and the developer tank 118 are connected with each other via a pump 286, which may conduct the wash water in the washing water tank 128 to the developer tank 118 as the diluent for supplying the replenisher to the developer tank 118.

Above the gum solution tank 130 of the finishing unit 126, there is provided a pair of transport rollers.178. The PS plate 112 fed from the transport roller 153 is guided to the transport rollers 178.

At the upstream side of the transport rollers 178, there are arranged a spray pipe 182 above the transport passage, and another spray pipe 288 below the transport passage. Each spray pipe sprays the gum solution scooped up by a pump 292 from a gum solution tank 290 onto the front or the rear surface of the PS plate 112.

Along with the transport of the PS plate 112, the transport rollers 178 squeezes the gum solution sprayed with spray pipe 182 for the desensitization of the surface of the PS plate 112. The gum solution squeezed off the surface of the PS plate 112 is collected to the gum solution tank 130. The gum solution in the tank 130 is circulated by the pump 294. The gum solution tank 130 is provided with an overflow pipe 296, which acts to collect the gum solution of the volume exceeding the predetermined liquid level to the waste tank 284.

The lower portion of the bottom transport roller 178 is immersed in the gum solution stored in the gum solution tank 130, and the bottom transport roller 178 scoops up the gum solution to coat the rear surface of the PS plate 112 for desensitization. The gum solution carried by bottom transport roller 178 is also transferred onto the top transport roller 178, thus preventing the dry-up of the top roller 178 and also the deposition of the solution ingredients on the surface of the top roller 178.

The PS plate 112 that has been subjected to the treatment in the finishing unit 126 is fed through the discharge port 204 of a casing 200 to the drying unit (not shown).

A lid body 210 serving as a shutter is provided at the discharge port 204. The lid body is supported by a pivot shaft 212, which can rotate with a driving means such as, for example, a solenoid (not shown).

The pivot shaft 212 rotates in accordance with the signal from the plate detector 208 located close to the insert port 202 to detect the passage of the PS plate 112. More specifically, the lid body 210 is retained at a substantially horizontal position (an open condition of the discharge port 204) during the period that the PS plate 112 is detected by the plate detecting sensor 208, and a predetermined period after the detection of the PS plate 112, and the lid body 210 is retained at a vertical position (a closed condition of the discharge port 204) during the time other than such period.

Hereinafter, a description will be given of the operation of this embodiment. First of all, processing tanks such as the developer tank 118, the washing water tank 128, the gum solution tank 130, etc., are covered with the casing 200 comprising the outer panel 114 and the main box 108, etc. And, in a case that no PS plate 112 is being processed in the automatic developing apparatus 100, the insert port 202 is closed as the blade 206 is in contact with the sidewall of the developer tank 118. On the other hand, the discharge port 204 is also closed with the lid body 210 in the vertical position since the sensor 208 does not detect the PS plate 112. Furthermore, the sub insert port 250 is also closed with the blade 252, and the space above the liquid surface cover 150 of the developing unit 122 is also closed with the blades 206 and 276. Thus, the developer in the developer tank 118, the washing water in the washing water unit 124 and the gum solution in the finishing unit 126 are well protected from the external atmosphere, and substantially no deterioration of the processing solutions due to $CO_2$ takes place. Since the decline of developing capability caused by the aging fatigue is minimized in the embodiment, the replenishing amount of the undiluted replenisher in the developing unit 122 can be drastically reduced. In particular, the liquid surface of the developer in the developer tank 118 is covered with the liquid surface cover 150, the contact-protecting effect of the developer with the external atmosphere is noticeable.

In order to minimize the contact of the developer with the external atmosphere, it is preferable to make the opening period of the lid body 210 as short as possible. Thus, it is preferable to close the lid body 210 except during the passage of PS plate 112.

Figure 2:
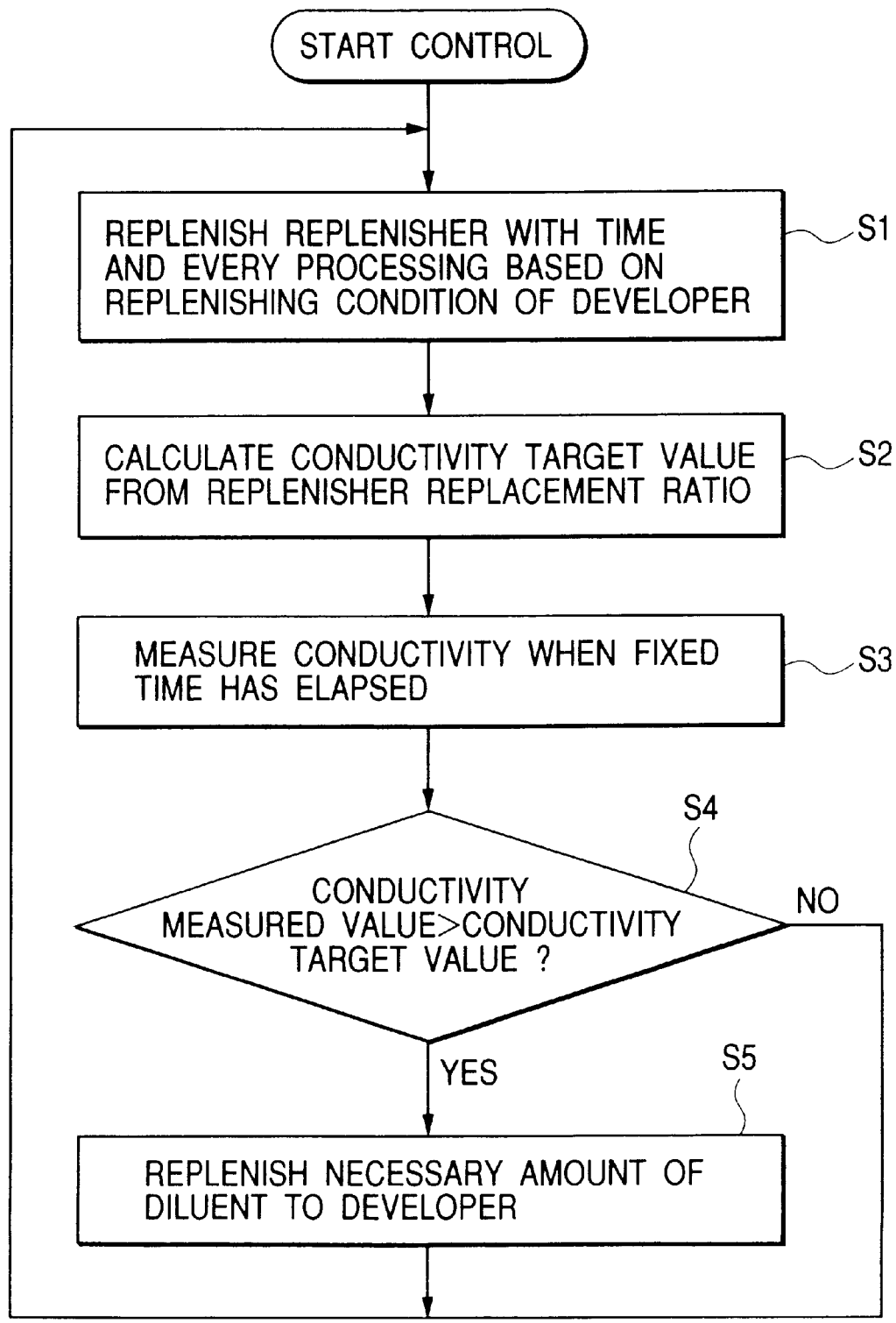
FIG. 2 is a flow chart for the replenishment of the replenisher for the developing unit in the automatic developing apparatus of the first embodiment.

As the control of the controller 50 is performed in a similar manner as was described in the first embodiment with reference to FIG. 2, the description on the control will be omitted.

EXAMPLE

Next, with the replenishing method described in the foregoing embodiments and a conventional replenishing method, the experiment measuring the fluctuation range of the pH (sensitivity) of the developer was performed.

Example 1
(Processing with a Silicate-based Developer)
(1) Type of the lithographic printing plate to be processed:
VS (a positive-working PS plate of Fuji Photo Film Co., Ltd.)
(2) Developer:
DP-7, a developer of common type for negative/positive-working PS plates of Fuji Photo Film Co., Ltd. (diluting ratio=1:8)
(3) Replenisher:
DP-7RW, a replenisher of common type for negative/positive-working PS plates of Fuji Photo Film Co., Ltd. (diluting ratio=1:6)
(4) Developer tank volume:
20,000 mL
(5) Areas of the PS plates to be processed:
0.2 $m^2$:0.8 $m^2$=2:5, 0.6 $m^2$/plate on average with the maximum of 0.8 $m^2$/plate.
(6) Processing amount: 106 $m^2$/day on average
(7) Day-to-day processing amount: See Table 1.

TABLE 1

Processing amount per day (m² × plate number)

| | Date | | | | | | | | | |
|---|---|---|---|---|---|---|---|---|---|---|
| | 1 Mon. | 2 Tue. | 3 Wed. | 4 Thu. | 5 Fri. | 8 Mon. | 9 Tue. | 10 Wed. | 11 Thu. | 12 Fri. | 15 Mon. |
| AM | 0 | 0 | 0.8 × 120 | 0.2 × 120 | 0.8 × 120 | 0 | 0 | 0.8 × 120 | 0.2 × 120 | 0.8 × 120 | 0 |
| PM | 0 | 0.8 × 121 | 0.8 × 120 | 0.2 × 120 | 0.8 × 120 | 0 | 0.8 × 121 | 0.8 × 120 | 0.2 × 120 | 0.8 × 120 | 0 |
| Total | 0 | 96.8 | 192 | 48 | 192 | 0 | 96.8 | 192 | 48 | 192 | 0 |

The experimental results are shown in Table 2.

TABLE 2

| | Maximum range of pH fluctuation | |
|---|---|---|
| | Ordinary condition | Dry condition (Water evaporation of 30 ml per hour) |
| Plate area-based replenishing method | 0.1 | — |
| Conductivity-based replenishing method | 0.02 | 0.06 |
| Method of Example 1 | 0.01 | 0.02 |

As is seen from Table 2, the replenishing method of Example 1 is almost equivalent to the conventional conductivity-based replenishing method, but far better than the conventional plate area-based replenishing method.

Further, with the replenishing method described in Example 1 and the conventional conductivity-based replenishing method, the fluctuation range of the pH (sensitivity) of developer caused by natural evaporation of water in the developer was experimentally calculated.

An experimental condition was set so that water in the developer naturally evaporates at 30 mL/hour.

Table 2 shows that the replenishing method of Example 1 can suppress the maximum range of pH fluctuation far better than the conventional, conductivity-based replenishing method. The reason is as follows. In Example 1, since the diluent is replenished based on the detected electric conductivity of the developer, even when an abnormal rise of the conductivity by water evaporation is caused, the fluctuation of the sensitivity can be reduced by compensating the diluent fallen short by the natural evaporation. On the other hand, the conventional, conductivity-based replenishing method stops the replenishment of the replenisher as a result of a misjudging that the sensitivity is high when the abnormal rise of conductivity by water evaporation is caused. Such a countermeasure leads to a decline of the sensitivity.

Example 2
(Processing with Non-Silicate Type Developer)
[Manufacture of a Positive-Working Photosensitive Lithographic Printing Plate]

The surface of a 0.24 mm thick, JIS A1050 aluminum plate was grained by using a nylon brush and a water suspension of purmice stone, and then rinsed with water. The plate was then immersed in a 10% aqueous NaOH solution for 60 sec at 70° C. for etching. After rinsed with running water, the etched plate was neutralized with a 20% aqueous nitric acid followed by rinsing with water. The plate was then subjected to electrolytic roughening treatment using a sinusoidal alternating wave form current with VA=12.7V and passing a cathode electric quantity of 260 coulomb/dm² in a 1% aqueous nitric acid. The surface roughness was measured as 0.55 μm in terms of Ra. Further, the plate was immersed in a 30% aqueous sulfuric acid for 2 min at 55° C. for desmatting, then subjected to anodic oxidation with a current density of 14 A/dm² to form a 2.5 g/m² anodic oxide film followed by rinsing with water. The resulting plate is designated as substrate [A].

Substrate [A] was treated with 0.1% by weight aqueous solution of sodium silicate at 20° C. for 10 sec to provide substrate [B].

Substrate [B] thus prepared was coated with the organic compound of the following formulation, and dried at 100° C. for 10 sec to form an organic intermediate layer with the coated density shown below.

coating formulation for an organic intermediate layer, and its coated amount after drying:

| Compound described below | 0.15 g |
|---|---|
| Salicilyc acid | 0.02 g |
| Methanol | 100 g |
| Purified water | 1.0 g |
| Coated amount on dry base | 7.0 mg/m² |

—(CH$_2$CH)$_{85}$—
|
[benzene ring]
|
COOH

—(CH$_2$CH)$_{15}$—
|
[benzene ring]
|
CH$_2$NEt$_3^+$ Cl$^-$

Number-averaged molecular weight (Mn)=2,100

A photosensitive layer was formed on substrate [B] by coating a photosensitive solution [A]. The coated amount of the layer on dry base was 1.15 g/m². Finally, in order to shorten vacuum contact time at exposure, a matt layer was formed according to the method disclosed in JP-A-61-28986 to provide a photosensitive lithographic printing plate.

[Photosensitive Solution A]

| | |
|---|---|
| Esterified product of 1,2-diazonaphthoquinone-5-sulfonyl chloride with pyrogallol-acetone resin (disclosed in Example 1 of U.S. Pat. No. 3,635,709) | 0.8 g |
| Cresol-formaldehyde novolac resin (molar ratio of meta to para = 6:4, weight-averaged molecular weight = 8,000, number average molecular weight = 2700, residual cresol: 0.8%) | 1.2 g |
| Phenol-formaldehyde novolak resin (weight-averaged molecular weight = 10,000, number average molecular weight = 1400, residual cresol: 0.8%) | 0.3 g |
| Resin other than novolak | 0.7 g |

Resin other than novolak

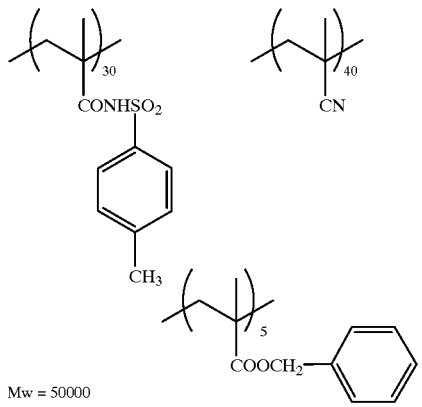

Mw = 50000

| | |
|---|---|
| Naphthoquinone-1,2-diazide-4-sulfonic acid chloride | 0.1 g |
| Tetrahydroxyphthalic anhydride | 0.2 g |
| Pyrogallol | 0.05 g |
| Benzoic acid | 0.02 g |
| 4-[P-N-(P-hydroxybenzoyl)aminophenyl]-2,6-bis (trichloromethyl)-S-triazine | 0.1 g |
| Victoria Pure Blue BOH (a product of Hodogaya Chemical Ind., a dye in which the counter anion was changed to 1-naphthalenesulfonic acid) | 0.1 g |
| Dye having structural formula (A) | 0.04 g |
| Fluorine-containing polymeric compound I | 0.05 g |
| Fluorine-containing polymeric compound II | 0.05 g |
| Fluorine-containing polymeric compound III | 0.01 g |
| Methyl ethyl ketone | 30 g |
| 1-methoxy-2-propanol | 15 g |

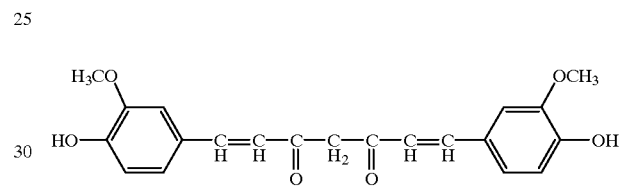

Note: The numerals indicate copolymerization ratio in mole %.

Fluorine-containing polymeric compounds

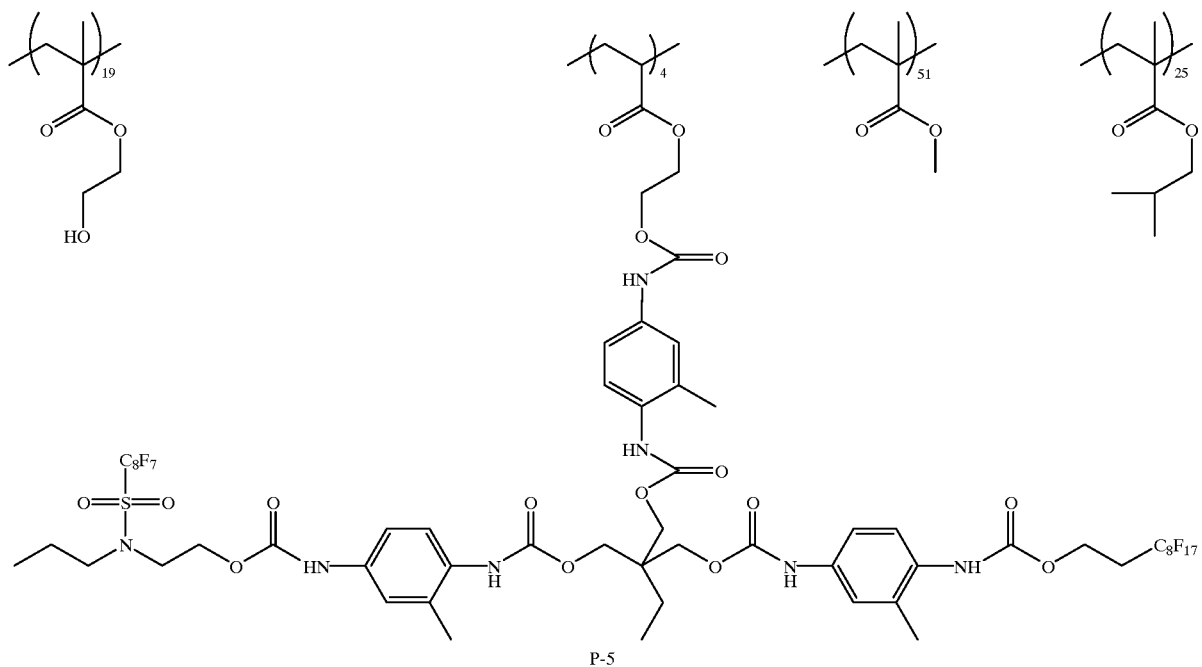

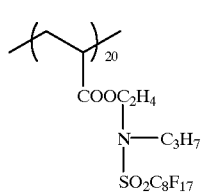
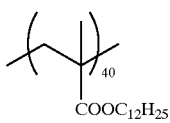
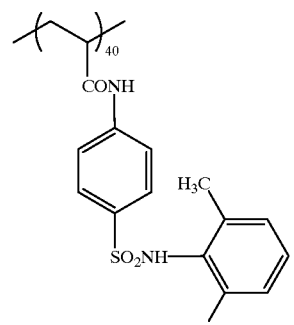

(II)

P-2

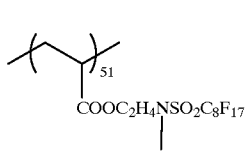
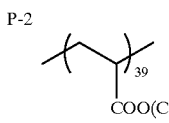

C-4

Mw = 40000

Note: The numerals indicate copolymerization ratio in mole %.

[Developer and Replenisher]
Stock developer (the working solution being prepared by diluting the following to 9 times with water)

| | |
|---|---|
| D-sorbitol | 20.3% by weight |
| Potassium hydroxide | 9.5% by weight |
| Ethylene oxide 30 mole adduct of triethanolamine | 0.16% by weight |
| DEQUEST 2066 (a chelating agent of Monsanto (USA),) | 0.1% by weight |
| Water | 69.94% by weight |

Replenisher (the following composition being diluted with 7.5 times water for use)

| | |
|---|---|
| D-sorbitol | 34.2% by weight |
| Potassium hydroxide | 15.2% by weight |
| Ethylene oxide 30 mole adduct of triethanolamine | 0.24% by weight |
| DEQUEST 2066 (a chelating agent of Monsanto (USA),) | 0.7% by weight |
| Water | 49.66% by weight |

[Two-Step Finishing Liquid]
The following two-step finishing liquid was diluted twice with water.
Desensitizing liquid [A]

| | |
|---|---|
| Gum Arabic | 3.6 g |
| Potatoe starch denatured with enzyme | 36.3 g |
| Corn starch denatured with enzyme | 7.4 g |
| Phosphorylated waxy corn starch | 3.6 g |
| Sodium salt of dioctylsulfosuccinic acid ester | 1.82 g |
| Ammonium dihydrogenphosphate | 0.74 g |
| Citric acid | 1.3 g |
| αAlanine | 2.40 g |
| Sodium α-olefinslulfonate | 0.88 g |
| EDTA-tetrasodium salt | 0.54 g |
| Ethylene glycol | 3.6 g |
| Benzyl alcohol | 4.6 g |
| Copolymer A | 0.50 g |
| Sodium dehydroacetate (antiseptic) | 0.08 g |
| Emulsion type, silicone-based anti-forming agent | 0.04 g |
| Water | 34.2 g |

Copolymer A

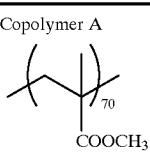

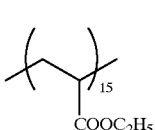

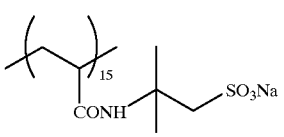

The other conditions are common to those in Example 1. The experimental results are shown in Table 3.

TABLE 3

| | Maximum range of pH fluctuation |
|---|---|
| Plate area-based replenishing method | 0.15 |
| Conductivity-based replenishing method | 0.04 |
| Method of Example 2 | 0.02 |

As is seen from Table 3, the replenisher supplying method of Example 2 is almost equivalent to the conventional, conductivity-based replenishing method, but far better than the plate area-based replenishing method in terms of the maximum range of pH fluctuation.

Examples 3 to 10

In the following, the preparing method of Developers A to D and Replenishers A to D used in Examples 3 to 10 and Comparative Examples 1 to 9 will be described.

[Developer A]

Developer DP-7, a product of Fuji Photo Film Co., Ltd., was diluted in the ratio of 1/9.

[Developer B]

An aqueous solution comprising the following ingredients was prepared in such a quantity as to fill the developer tank.

| | |
|---|---|
| A potassium salt comprising D-sorbitol as an unreducing saccharide and potassium oxide as a base | 5.0% |
| Olfin AK-02 (made by Nisshin Chemical Co., Ltd.) | 0.015% |
| Surfactant D-1105 (made by Takemoto Yushi Co., Ltd.) | 0.010% |
| Water to make | 1000 mL |
| The following compound | 0.01 g |

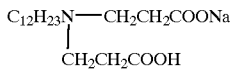

[Developer C]

Developer DP-4, a product of Fuji Photo Film Co., Ltd., was diluted in the ratio of 1/8.

[Developer D]

Developer LP-D, a product of Fuji Photo Film Co., Ltd., was diluted in the ratio of 1/10.

[Developer E]

The following composition was prepared as Developer E.

| | |
|---|---|
| Potassium hydroxide | 0.15 g |
| Poly (oxyethylene) phenyl ether (n = 1.3) | 5.0 g |
| Chilest 400 (a chelating agent) | 0.1 g |
| Water | 94.75 g |

[Replenisher A]

Developer replenisher DP-7RW, a product of Fuji Photo Film Co., Ltd., was used.

[Replenisher B]

The following composition was prepared as Replenisher B. An aqueous solution comprising the following ingredients was prepared in such a quantity as to fill the developer tank.

| | |
|---|---|
| A potassium salt comprising D-sorbitol as an unreducing saccharide and potassium oxide as a base | 5.0% |
| Olfin AK-02 (made by Nisshin Chemical Co., Ltd.) | 0.015% |
| Water to make | 1000 mL |
| The following compound | 0.01 g |

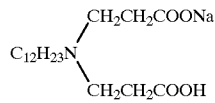

[Replenisher C]

Developer replenisher DP-4R, a product of Fuji Photo Film Co., Ltd., was used.

[Replenisher D]

Developer replenisher LP-DR, a product of Fuji Photo Film Co., Ltd., was used.

[Replenisher E]

The following composition was prepared as Replenisher E.

| | |
|---|---|
| Potassium hydroxide | 6.0 g |
| Newkol B13 | 23.0 g |
| Chilest 400 | 1.0 g |
| Purified water | 70.0 g |

Photosensitive printing plates A to J used in Examples 3 to 10 and Comparative Examples 1 to 9 are described as for their preparing methods, processings prior to development and exposure conditions.

[Photosensitive Printing Plate A]

A photosensitive printing plate A was prepared according to Example 1 of JP-A-2000-231188.

The plate was image exposed for 1 min with a printer FT26V2UPNS, a product of Nuarc Co., Ltd. in USA equipped with a 2 kW metal halide lamp as the light source.

The developer speed was evaluated with a step wedge (a product of Fuji Photo Film with 0.15 step difference in density) image obtained by the same exposure condition as described above.

[Photosensitive Printing Plate B]

Plate B was prepared according to Example 1 of JP-A-7-295212. The plate was image exposed by 50 counts with a printer FT26V2UPNS, a product of Nuarc Co., Ltd. in USA equipped with a 2 kW metal halide lamp as the light source.

The developer speed was evaluated with a step wedge (a product of Fuji Photo Film with a 0.15 step difference in density) image obtained by the same exposure condition as described above.

[Photosensitive Printing Plate C]

Synthetic Example 1

Compound (a) (25.6 g) as a first polymerization component, compound (b) (26.4 g) as a second component, 20.4 g lauryl methacrylate as a third component and dimethylacetamide (160 g) were charged in a 500 ml three-neck flask. The flask was filled with nitrogen and the content was heated to 65° C. under stirring. 2,2'-Azobis (2,4-dimethylvaleronitrile) (2.30 g) was added under stirring. The temperature of the content rose to 75° C. in 4 hr. The content was kept at that temperature for another hour. After the reaction terminated, the content was cooled to room temperature and then poured into 400 mL water. The separated solid product was filtered and dried.

Fluorinated aliphatic group-containing compound P-2 was thus obtained with a yield of 68.4 g. GPC analysis proved that the solid product is a polymer with a weight-averaged molecular weight of about 30,000.

Compound (a) in Synthetic Example 1

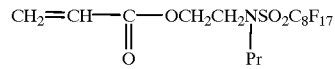

-continued

Compound (b) in Synthetic Example 1

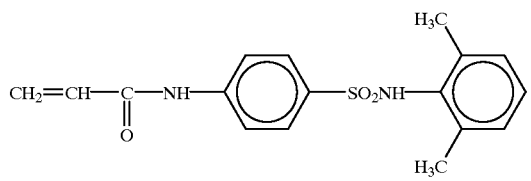

Synthetic Example 2

Fluorinated aliphatic group-containing compound P-15 (weight-averaged molecular weight=25,000) was prepared similarly to Synthetic Example 1 except that components (1), (2) and (3) were changed.

A JIS A 1050 aluminum plate with a thickness of 0.24 mm and a width of 1030 mm was continuously processed as follows.

(a) The surface of the aluminum plate was mechanically grained with rotating nylon brush rollers under a continuous feeding of a polishing slurry comprising a polishing agent (purmice) having a specific gravity of 1.12 dispersed in water onto the plate surface. The average particle size of the polishing agent was 40 to 45 $\mu$m with the maximum size of 200 $\mu$m. The nylon brush consisted of 6·10 nylon, the hair length was 50 mm and the hair diameter 0.3 mm. The hairs were planted into pits densely formed on the surface of a $\phi$300 mm stainless steel pipe. Three rotating brushes were used. Two $\phi$200 mm sustaining rollers lying beneath the brush were separated by 300 mm from each other. The brush roller was pressed to the aluminum plate until the load of the brush rotating motor increased by 7 kw from the load before the brush was brought into contact with the plate. The brush was rotated in the same direction as that of the plate transport at 200 rpm.

(b) The aluminum plate was subjected to etching by spraying an aqueous solution containing 2.6% by weight sodium hydroxide and 6.5% by weight of aluminum ion at 70° C. until the plate was dissolved by 13 g/m². Then, the etched plate was rinsed by spraying water.

(c) Next, desmutting treatment was carried out by spraying an aqueous 1% by weight nitric acid solution containing 0.5% by weight aluminum ion at 30° C. followed by rinsing with water spray. The nitric acid solution used for the desmutting was a waste resulting from AC electrochemical graining.

(d) An electrochemical graining was carried out using 60 Hz alternating voltage in a continuous manner. The aqueous electrolytic solution contained 1% by weight nitric acid, 0.5% by weight aluminum ion and 0.007% by weight ammonium ion, and kept at 50° C. TP, the time for the current reaching to the peak from zero, was 2 msec, and the waveform of the AC source was trapezoidal with a duty ratio of 1:1. A carbon counter electrode and a sub-anode made of ferrite were used. Two electrolytic vessels were used. The peak current was 30 A/dm² while the total electric quantity was 180 C/dm² when the aluminum plate acted as anode. To the sub-anode, 5% of the source current was shared. After such graining, the plate was rinsed with water spray.

(e) The plate was etched by spraying an aqueous solution containing 26% by weight sodium hydroxide and 6.5% by weight aluminum ion at 70° C. until the plate was dissolved by 1.3 g/m². By this etching operation, the smut that had been formed during the previous electrochemical graining and that mainly consisted of aluminum hydroxide was removed, and the edge portion of the pit was made smooth by dissolving. Then, the etched plate was rinsed by water spray.

(f) Another desmutting treatment was carried out on the plate by spraying aqueous 25% by weight sulfuric acid solution containing 0.5% by weight aluminum ion at 60° C. Then the plate was rinsed with water spray.

(g) Using an anodic oxidation apparatus for two-step electrolysis in which the first and second electrolytic parts were 6 m long, in which the first and second current feeding parts were 3 m long, and in which the first and second current feeding electrodes were 2.4 m long, anodic oxidation was carried out on the plate whereby the electrolytic parts were charged with aqueous 100 g/l sulfuric acid that contained 0.5% by weight aluminum ion, had a density of 1.1 g/cm³ as well as a conductivity of 0.39 S/cm, and kept at 50° C. After the electrolysis the plate was sprayed with rinsing water. The final quantity of anodic oxide film was 2.4 g/m².

(h) The plate thus grained and anodized was immersed in an aqueous 0.1% by weight sodium silicate solution for 10 sec at 20° C., then rinsed by spraying water and dried. After each treatment and rinsing, the plate was passed between nip rollers to squeeze fluid.

The back surface of the plate was coated with the following diluted sol-gel transforming mixture with a coating bar, and dried at 100° C. for 1 min. The coated weight of this back coating was 60 mg/m² on dry base.

Sol-gel transforming mixture:

| Tetraethyl silicate | 50.0 parts by weight |
|---|---|
| Water | 86.4 parts by weight |
| Methanol | 10.8 parts by weight |
| Phosphoric acid (85%) | 0.08 parts by weight |

Stirring the mixture of the above ingredients caused temperature elevation in about 35 min. After the termination of the reaction in 40 min stirring, the following diluent was added to prepare the back coating solution.

Diluent:

| Pyrogallol-acetone condensed resin | 15.0 parts by weight |
|---|---|
| Dibutyl maleate | 5.0 parts by weight |
| Methanol silica sol | 70.0 parts by weight |
| (made by Nissan Chemical Industries, Ltd.) | |
| Megafac F-177 | 0.1 parts by weight |
| (made by Dai-Nippon Ink & Chemicals Inc.) | |
| Methanol | 650 parts by weight |
| 1-Methoxy-2-propanol | 200 parts by weight |

Then, the front surface of the plate was provided with an organic intermediate layer having a coated weight of 7 mg/m² after drying by coating the following composition with a coating bar and drying at 100° C. for 10 sec.

Coating composition for the organic intermediate layer:

| Compound A with a number-averaged moleculer weight of 2100 | 0.15 parts by weight |
|---|---|
| Salicylic acid | 0.02 parts by weight |
| Methanol | 100.0 parts by weight |
| Water | 1.0 parts by weight |

Compound A

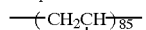
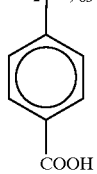
COOH

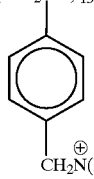
$CH_2N(Et)_3Cl^{\ominus}$ ⊕

Note: The numerals indicate copolymerization ratio in mole %.

On the organic intermediate layer of the plate was coated a photosensitive coating solution of the following composition with a coating bar. After drying at 100° C. for 60 sec, the coated weight was 1.15 g/m².

Photosensitive coating solution 1:

| | |
|---|---|
| Esterified product of pyrogallol-acetone resin with 1,2-diazonaphthoquinone-5-sulfonyl chloride (described in Example 1 of U.S. Pat. No. 3,635,709) | 0.8 parts by weight |
| Cresol-formaldehyde novolak resin (meta to para ratio: 6:4, weight-averaged molecular weight: 8000, number average molecular weight = 2700, residual cresol: 0.8%) | 1.2 parts by weight |
| Phenol-formaldehyde novolak resin (weight-averaged molecular weight: 10000, number average molecular weight = 1400, residual cresol: 0.8%) | 0.5 parts by weight |
| Non-novolak resin having the following formula, (weight-averaged molecular weight: 50000) | 1.2 parts by weight |
| Naphthoquinone-1,2-diazide-4-sulfonic acid chloride | 0.1 parts by weight |
| Tetrahydroxyphthalic anhydride | 0.2 parts by weight |
| 4-[P-N-(P-hydroxybenzoyl)aminophenyl]-2,6-bis (trichloromethyl)-S-triazine | 0.1 parts by weight |
| Victoria Blue BOH (a product of the Hodogaya Chemical product Ind., a dye in which the counter anion was changed to naphthalene sulfonic acid) | 0.1 parts by weight |
| Dyestuff of general formula (I) shown below | 0.04 parts by weight |
| Methyl ethyl ketone | 30 parts by weight |
| 1-Methoxy-2-propanol | 15 parts by weight |
| Fluorine-containing polymeric compound I | 0.05 parts by weight |
| Fluorine-containing polymeric compound II | 0.05 parts by weight |
| Fluorine-containing polymeric compound III | 0.01 parts by weight |

Non-novolak resin:

Non-novolak resin:
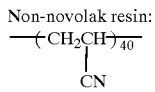 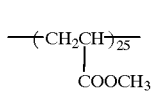 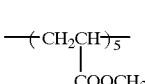
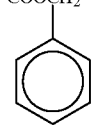

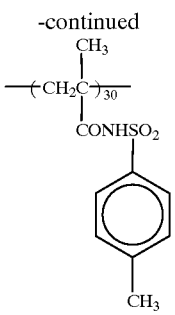
Mw = 50000

Note: The numerals indicate copolymerization ratio in mole %.

Dye (I)

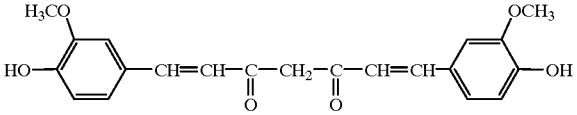

A matt layer was formed onto the surface of the photosensitive layer thus formed by spraying a matt layer forming resin solution as follows.

A 12% aqueous solution of methyl methacrylate/ethyl acrylate/acrylic acid copolymer (weight ratio of initially charged monomer=65:20:15) part of which had been rendered to the sodium salt (in some cases, potassium or ammonium salt) was prepared. This matt layer forming solution was sprayed with a rotary mist forming electrostatic coating machine under the following conditions.

| | |
|---|---|
| Rotation of the mist forming head | 15,000 rpm |
| Feeding rate of the solution | 65 mL/min |
| Voltage applied to the mist forming head | −75 kV |
| Surrounding temperature during coating | 25° C. |
| Relative humidity of the surrounding atmosphere | 50% RH |

The coated surface was moistened by spraying water vapor after 1.5 sec following the coating, and then dried by blowing a warm air stream of 60° C., 10% RH for 5 sec starting from 3 sec after moistening. The coated weight of the matt layer was 130 mg/m².

The finished photosensitive plate was given an image exposure for 1 min with a printer FT26V2UPNS, a product of Nuarc Co., Ltd. in USA equipped with a 2 kW metal halide lamp as light source.

The developer speed was evaluated with a step wedge (a product of Fuji Photo Film with 0.15 step difference in density) image obtained by the same exposure condition as described above.

[Photosensitive Printing Plate D]

The surface of a 1S type aluminum plate with 0.24 mm thickness was grained with nylon brushes and an aqueous suspension of 400 mesh pumrice stone, and rinsed with water. Then, the plate was immersed in an aqueous 20% sodium hydroxide kept at 70° C. for 60 sec for etching, and rinsed with running water. After neutralized with 20% nitric acid, the plate was electrolytically grained by using a sinusoidal AC of $V_A$=12.7V and $V_C$=9.1V in 1% aqueous nitric acid. The anode electric quantity was 170 coulomb/dm². Then, the plate was immersed in 25% aqueous sodium hydroxide at 45° C. for 15 sec for etching, then immersed in 30% aqueous sulfuric acid at 55° C. for 2 min for desmutting. Further, the plate was anodized in 7% aqueous sulfuric acid so as to form 1.8 g/m² aluminum oxide. Finally by immersing in 3% aqueous sodium silicate at 70° C. for 1 min, washing with water and drying, the aluminum plate having a hydrophilic surface was obtained.

On the hydrophilic surface of the aluminum plate thus prepared, the following photosensitive coating solution (A) was coated with a coating bar and dried at 80° C. for 30 sec. The coated weight was 0.1 g/m² on dry base.

[Photosensitive Coating Solution (A)]

| | |
|---|---|
| diisocyanate, 2,2-bis(hydroxymethyl)propionic acid and tetraethylene glycol with a weight-averaged molecular weight of 100,000 (hereinafter, referred to as "polyurethane resin a1") | 1.0 g |
| Copolycondensed diazonium resin comprising 5/5 (in molar ratio) dodecylbenzene sulfonic acid salt of 4-diazo-3-methoxydiphenylamine and phenoxyacetic acid (hereinafter, referred to as "diazo resin b1") | 0.3 g |
| Megafac F-176, a fluorine containing surfactant (made by Dai-Nippon Ink & Chemicals Inc.) | 0.05 g |
| Methyl ethyl ketone | 50 g |
| Methanol | 50 g |

Another photosensitive coating solution (C) which follows was coated on the dried photosensitive layer with a coating bar, and dried at 100° C. for 1 min. The coated weight of the photosensitive component including that of the solution (A) was 1.0 g/m² on dry base.

[Photosensitive Coating Solution (C)]

| | |
|---|---|
| N-[6-(methacryloyloxy)hexyl]-2,3-dimethylmaleimide/methacrylic acid (60/40) copolymer | 5.0 g |
| Sensitizer having a chemical structure shown below | 0.3 g |
| Copolycondensed diazonium resin comprising 5/5 in molar ratio of dodecylbenzene sulfonic acid salt of 4-diazophenylamine and phenoxyacetic acid (hereinafter, referred to as "diazo resin c1") | 0.3 g |
| Hexafluorophosphoric acid salt of 4-diazo-3-methoxydiphenylamine | 0.2 g |
| Victoria Pure Blue BOH made by Hodogaya Chemical Industries, Ltd. | 0.1 g |
| Megafac F-176, a fluorine containing surfactant (made by Dai-Nippon Ink & Chemical Industries, Ltd | 0.1 g |
| Propylene glycol monomethyl ether | 50 g |
| Methyl ethyl ketone | 50 g |
| Methanol | 20 g |

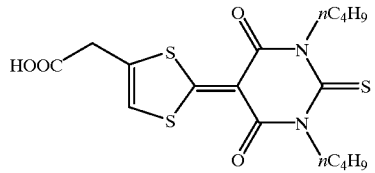

The finished photosensitive plate was given 200 count image exposure for 1 min with a printer FT26V2UPNS, a product of Nuarc Co., Ltd. in USA and equipped with a 2 kw metal halide lamp as light source.

The developer speed was evaluated with a step wedge (a product of Fuji Photo Film with 0.15 step difference in density) image obtained by the same exposure condition as described above.

[Photosensitive Printing Plate E]

A photosensitive printing plate E was prepared according to Example 1 of JP-A-11-119419.

The plate was subjected to an image exposure with a platesetter Luxcel Platesetter 9000 CTP, a product of Fuji Photo Film Co., Ltd. The output power was 216 mW, and the drum rotated at 1000 rpm with 2438 dpi image resolution. The image area occupied 20% of the total image area.

The developer speed was evaluated by giving an area of the plate sensitometric stepped exposures with use of an original pattern installed in Luxcel Platesetter 9000 CTP. The stepped exposures ranged from 27 mW (13.5 mJ/cm²) to 270 mW (135 mJ/cm²) with a fixed interval of 13.5 mW (13.5 mJ/cm²). In other words, these stepped exposures consisted of 10, 15, 90, 95 and 100% of the maximum energy at the plate surface, thus the energy difference from the adjacent image area ranged from 5 to 50%.

[Photosensitive Printing Plate F]

A photosensitive printing plate F was prepared according to Example 1 of JP-A-2000-284474.

[Photosensitive Printing Plate G]

[Preparation of Plate Substrate]

JISA1050 aluminum alloy comprising 99.5% or more of aluminum, 0.30% iron, 0.10% silicon, 0.02% titanium and 0.013% copper was melted, purified and cast. The purification treatment consisted of degassing unnecessary gaseous ingredients such as hydrogen, and filtration with a ceramic tube filter. DC casting method was employed for casting. After the surface was scalped 10 mm deep, a 500 mm thick solidified cast block was subjected to homogenizing treatment at 550° C. for 10 hr to prevent the intermetallic compound from growing too coarse. Then, the block was hot rolled at 400° C., intermediately annealed in a continuous annealing furnace at 500° C. for 60 sec, and then cold rolled to a 30 mm thick aluminum alloy web. By controlling the surface roughness of the cold roll, the average roughness around the center line average surface roughness Ra was regulated to 0.2 μm. The web was further machined with a tension leveler to improve its flatness.

Next, the web surface was treated to make a desirable substrate for lithographic printing plate.

Firstly, the rolling grease remaining on the aluminum alloy plate surface was removed by the degreasing treatment with 10% aqueous sodium aluminate kept at 50° C. for 30 sec. Then, neutralization with 30% aqueous sulfuric acid was carried out at 50° C. for 30 sec followed by a smut removing treatment.

Then, so-called graining which means controlled roughening of the substrate surface was performed in order to achieve a firm bonding of a photosensitive layer to the substrate and also to impart a water receptivity to non-image areas. The aluminum alloy web was passed in an aqueous solution containing 1% nitric acid and 0.5% aluminum nitrate kept at 45° C. with the application of AC of 20 A/dm² current density and 1:1 duty ratio from an indirect electricity supplying cell until the anode electric quantity reached 240 C/dm². Further, the web was etched with 10% aqueous sodium aluminate at 50° C. for 30 sec, then neutralized with 30% aqueous sulfuric acid at 50° C. for 30 sec, and subjected to smut removing treatment To improve the abrasion resistance as well as the chemical resistance and the water receptivity of the surface, an oxide film was formed by anodization as follows. The aluminum web was passed through an electrolytic solution comprising 20% aqueous sulfuric acid kept at 35° C. under the application of DC of 14 A/dm² from an indirect electricity supplying cell so as to form an anodic oxide film of 2.5 g/m².

To secure a sufficient level of hydrophilic property as the non-image area of lithographic printing plate, the web was subjected to silicate treatment. The web was passed through a 1.5% aqueous solution of No. 3 sodium silicate (i.e., sodium disilicate) kept at 70° C. in such a manner that the plate be in contact with the solution for 15 sec, followed by rinsing with water. The adhered amount of silicon proved to be 10 mg/m². The Ra value (center line surface roughness) of the substrate thus prepared was 0.25 μm.

[Undercoating]

The aluminum substrate was coated with the following undercoating solution by means of wire bar, and dried in a hot air type drying apparatus at 90° C. for 30 sec. The coated weight was 10 mg/m² on dry base.

<Undercoating solution>

| | |
|---|---|
| Copolymer of ethyl methacrylate and sodium salt of 2-acrylamide-2-methyl-1-propane sulfonic acid with 75:15 molar ratio | 0.1 g |
| 2-Aminoethyl phosphonic acid | 0.1 g |
| Methanol | 50 g |
| Ion exchanged water | 50 g |

[Photosensitive Layer]

Photosensitive layer coating solution [P] having the following composition was prepared, which was coated with a wire bar on the undercoated aluminum web described above. The resulting photosensitive plate was dried at 115° C. for 45 sec in a hot air type drying apparatus. The coated weight of this solution ranged from 1.2 to 1.3 g/m².

<Photosensitive layer coating solution [P]>

| | |
|---|---|
| IR absorber [IR-6] | 0.08 g |
| Onium salt [OI-6] | 0.30 g |
| Dipentaerithritol hexaacrylate | 1.00 g |
| Copolymer of allyl methacrylate and methacrylic acid with 80:20 molar ratio (weight averaged molecular weight: 120,000) | 1.00 g |
| Naphthalene sulfonic acid salt of Victoria Pure Blue | 0.04 g |
| Megafac F-176, a fluorine containing surfactant (made by Dainippon Ink & Chemicals Inc.) | 0.01 g |
| Methyl ethyt ketone | 9.0 g |
| Methanol | 10.0 g |
| 1-Methoxy-2-propanol | 8.0 g |

[IR-6]

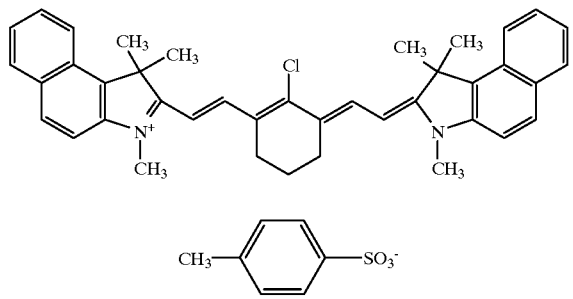

[OI-6]

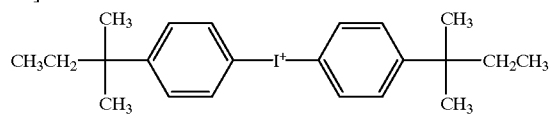

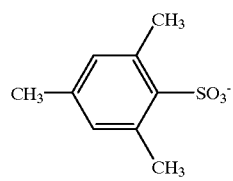

The plate was subjected to an image exposure with a platesetter named Trendsetter 3244 VFS, a product of Creo equipped with a water-cooled 40W IR semiconductor laser. The output power was 9W, and the external drum rotated at 210 rpm, and the plate surface energy 100 mJ/cm² with 2400 dpi image resolution.

[Photosensitive Printing Plate H]

A photosensitive printing plate H was prepared according to Example 1 of JP-A-2000-039724.

The plate was subjected to an image exposure with a Gutenberg platesetter, a product of Heidelberg with 180° scanning exposure angle. The energy density at the plate surface was 0.2 mJ/m² and the image resolution 2400 dpi. After exposure, the plate was heated at 100° C. for 1 min.

The developer speed was evaluated by a piece of the plate exposed through a step wedge (density step being 0.15) film contacted with the plate.

[Photosensitive Printing Plate I]

Photosensitive printing plate I was prepared according to Example 15 described in JP-A-11-352691.

The plate was given an image exposure with a scanning exposure system installed with a 75 mW air-cooled argon laser as light source whereby the exposure energy density was 0.20 mJ/m² on the plate surface. After exposure, a post heating was performed at 100° C. for 1 min.

The developer speed was evaluated by a piece of the plate contact-exposed through a step tablet (a product of Fuji Photo Film Co., Ltd.) in which the transmission light intensity decreased by a factor of $\frac{1}{1.4}$ for each step. The exposure conditions were as follows: plate surface illuminance= 0.0132 mV/cm² and exposure time=30 sec.

[Photosensitive Printing Plate J]

[Substrate]

(Substrate: Anodized Aluminum Substrate)

The surface of a 1S type and 0.30 mm thick aluminum plate was grained with No. 8 nylon brushes and an aqueous suspension of 800 mesh purmice stone, and rinsed with running water. Then, the plate was immersed in an aqueous 10% sodium hydroxide kept at 70° C. for 60 sec for etching, and rinsed with running water. After neutralized with 20% nitric acid, the plate was rinsed with water. The plate was further electrolytically grained by using a sinusoidal AC of 12.7V $V_A$ in 1% aqueous sulfuric acid. The anode electric quantity was 300 coulomb/dm². The Ra value of the substrate representing center line surface roughness was 0.45 μm. Then, the plate was immersed in 30% aqueous sulfuric acid at 55° C. for 2 min for desmutting. Further, the plate was anodized in 20% aqueous sulfuric acid kept at 33° C. with a cathode arranged over the grained surface with 5 A/dm² current density for 50 sec to give rise to the thickness of anodic oxide film of 2.7 g/m².

An undercoating solution of the following composition was applied onto the finished surface to give the coated weight of P of about 0.05 g/m².

<Undercoating Solution>

| | |
|---|---|
| Phenyl phosphonic acid | 2 parts by weight |
| Methanol | 800 parts by weight |
| Water | 50 parts by weight |

[Photosensitive Material]

The surface of the undercoated substrate was provided with a photopolymerizable composition having a coated weight of 1.5 g/m² on dry base and dried at 100° C. for 1 min.

On the photosensitive layer was coated 3% aqueous solution of polyvinyl alcohol which had 98% degree of saponification and 500 degree of polymerization so that the coated weight be 2.5 g/m² on dry base. By drying the coated layer at 120° C. for 3 min, a photosensitive printing plate was obtained.

[Photosensitive Coating Solution (Photopolymerizable Composition)]

| | |
|---|---|
| Ethylenically unsaturated compound (A) | 1.7 parts by weight |
| Organic linear polymer (B) | 1.9 parts by weight |
| Sensitizer (C) | 0.15 parts by weight |
| Photo initiator (D) | 0.30 parts by weight |
| Additive (S) | 0.50 parts by weight |
| Fluorine-containing surfactant (Megafac F-177 (made by Dai-Nippon Ink & Chemicals Inc.) | 0.03 parts by weight |
| Thermal polymerization initiator (DN-nitrosohydroxylamine aluminum salt) | 0.01 parts by weight |
| ε-type copper phthalocyanine dispersion | 0.2 parts by weight |
| Methyl ethyl ketone | 30.0 parts by weight |
| Propylene glycol monomethyl ether | 30.0 parts by weight |

The chemical structures of the ethylenically unsaturated compound (A), the organic linear polymer (B), the sensitizer (C), the photo initiator (D) and the additive (S) are shown below.

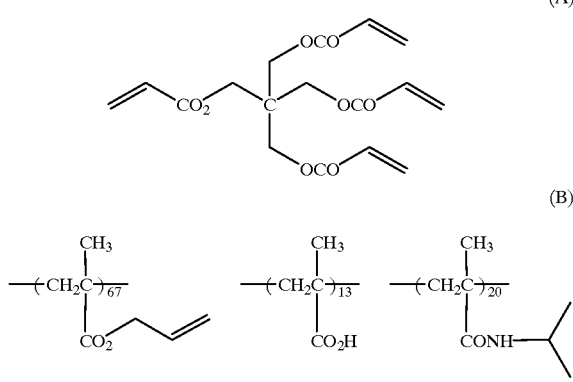

(A)

(B)

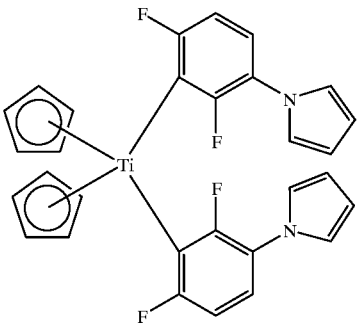

(C)

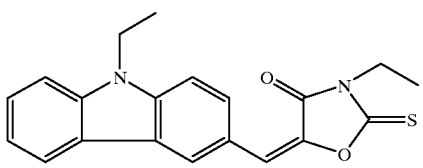

(D)

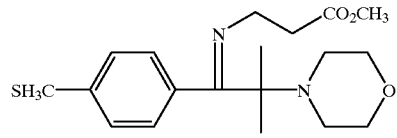

(S)

Mw150000

The plate was subjected to an image exposure with a 100 mW FD·YAG laser (wavelength=532 nm) installed in Plate Jet 4, a product of CSI Inc. The image resolution was 4000 dpi. After exposure, the plate was post-baked at 100° C. for 1 min.

The developer speed was evaluated by a piece of the plate contact-exposed through a step wedge (density step being 0.15) film.

([Photosensitive Printing Plate K]

The surface of a 1S type and 0.30 mm thick aluminum plate was grained with No. 8 nylon brushes and an aqueous suspension of 800 mesh purmice stone, and rinsed with running water. Then, the plate was immersed in an aqueous 10% sodium hydroxide kept at 70° C. for 60 sec for etching, and rinsed with running water. After neutralized with 20% nitric acid, the plate was rinsed with water. The plate was further electrolytically grained by using a sinusoidal AC of 12.7V $V_A$ in 1% aqueous sulfuric acid. The anode electric quantity was 300 coulomb/dm². The Ra value of the substrate representing center line surface roughness was 0.45.m. Then, the plate was immersed in 30% aqueous sulfuric acid at 55° C. for 2 min for desmutting. Further, the plate was anodized in 20% aqueous sulfuric acid kept at 33° C. with a cathode arranged over the grained surface with 5 A/dm² current density for 50 sec to give rise to the thickness of anodic oxide film of 2.7 g/m².

On the surface of the thus processed aluminum plate, high-speed photopolymerizable composition 1 of the following composition was coated to give a dried coated weight of 1.5 g/m², and dried at 100° C. for 1 min.

[Photopolymerizable Composition 1]

| | |
|---|---|
| Ethylenically unsaturated compound (A1) | 1.5 parts by weight |
| Organic linear polymer (B1) | 2.0 parts by weight |
| Sensitizer (C1) | 0.15 parts by weight |

-continued

| | |
|---|---|
| Photo initiator (D1) | 0.2 parts by weight |
| -type copper phthalocyanine (F1) dispersion | 0.02 parts by weight |
| Fluorine-containing surfactant (Megafac F-177 made by Dainippon Ink Chemical Industries, Ltd.) | 0.03 parts by weight |
| Methyl ethyl ketone | 9.0 parts by weight |
| Propylene glycol monomethyl ether acetate | 7.5 parts by weight |
| Toluene | 11.0 parts by weight |

A1

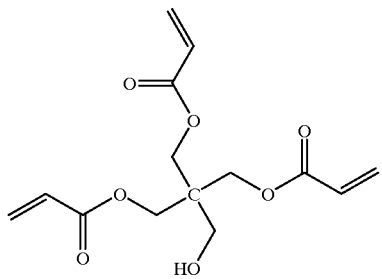

B1

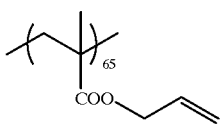

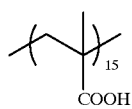

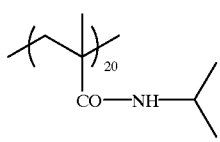

Mw: 150000

C1

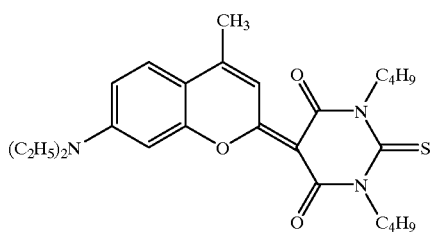

D1

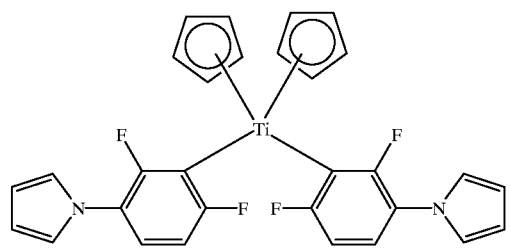

E1

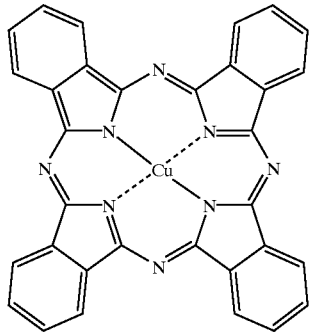

On the photosensitive layer was coated 3% aqueous solution polyvinyl alcohol which had 98% degree of saponification and 500 degree of polymerization in such a manner that the coated weight be 2.5 g/m² on dry base. By drying the coated layer at 120° C. for 3 min, a photosensitive printing plate was obtained.

The plate was subjected to an image exposure with a 100 mW FD·YAG (wavelength=532 nm) installed in Plate Jet 4, a product of CSI Inc. The image resolution was 4000 dpi and the exposure at the plate surface was 100 J/cm². After exposure, the plate was baked at 100° C. for 1 min.

The developer speed was evaluated by a piece of the plate contact-exposed through a step wedge (density step being 0.15) film.

Examples 3 to 10

By adopting the replenishing method of the invention, the photosensitive plates in Tables 4–6 were continuously processed with the developers and the replenishers under the processing conditions all listed in the same table, and the speed as well as the stability of developer was evaluated. The results are shown in Table 7.

Comparative Examples 1 to 8

The speed as well as the stability of developer was evaluated for the replenishing methods which do not detect nor refer to the conductivity of developer but which carries out replenishment based on processed quantity and elapsed (operating/suspending) time. The photosensitive plates in Tables 4–6 were continuously processed with the developers and the replenishers under the processing conditions all listed in the same table. The results are shown in Table 7.

Comparative Example 9

The speed as well as the stability of developer was evaluated for the replenishing method which is disclosed in JP-A-64-21451 and replenishes only when the developer conductivity falls below a target value. The photosensitive plates in Tables 4–6 were continuously processed with the developers and the replenishers under the processing conditions all listed in the same table. The results are shown in Table 7.

TABLE 4

|  | Replenishing method | Photosensitive plate | Developer | Replenisher | Processing condition |
|---|---|---|---|---|---|
| Example 3 | Method of the invention | Plates A, B, C and D | Developer A | Replenisher A | Processing condition 1 |
| Example 4 | Same as above | Plates C, D and E | Developer B | Replenisher B | Processing condition 2 |
| Example 5 | Same as above | Plate F | Developer C | Replenisher C | Processing condition 3 |
| Example 6 | Same as above | Plate G | Developer E | Replenisher E | Processing condition 4 |
| Example 7 | Same as above | Plate K | Developer E | Replenisher E | Processing condition 5 |
| Example 8 | Same as above | Plate H | Developer D | Replenisher D | Processing condition 6 |
| Example 9 | Same as above | Plate I | Developer D | Replenisher D | Processing condition 7 |
| Example 10 | Same as above | Plate J | Developer E | Replenisher E | Processing condition 8 |
| Comparative Example 1 | Area- and aging-based replenishing method (without conductivity detection) | Plates A, B, C and D | Developer A | Replenisher A | Processing condition 1 |
| Comparative Example 2 | Same as above | Plates C, D and E | Developer B | Replenisher B | Processing condition 2 |
| Comparative Example 3 | Same as above | Plate F | Developer C | Replenisher C | Processing condition 3 |
| Comparative Example 4 | Same as above | Plate G | Developer E | Replenisher E | Processing condition 4 |
| Comparative Example 5 | Same as above | Plate K | Developer E | Replenisher E | Processing condition 5 |
| Comparative Example 6 | Same as above | Plate H | Developer D | Replenisher D | Processing condition 6 |
| Comparative Example 7 | Same as above | Plate I | Developer D | Replenisher D | Processing condition 7 |
| Comparative Example 8 | Same as above | Plate J | Developer E | Replenisher E | Processing condition 8 |
| Comparative Example 9 | Conductivity-based replenishing method (disclosed in U.S. Pat. No. 4882246) | Plates A and B | Developer A | Replenisher A | Processing condition 1 |

TABLE 5

|  |  |  |  |  |  | Replenished amount based on | | | |
|---|---|---|---|---|---|---|---|---|---|
|  | Automatic processor | Developing temp. (° C.) | Developing time (sec) | Developer tank vol. (ml) | Transport speed (mm/min) | Operating time elapse (ml/hr) | Suspension time elapse (ml/hr) | Processed amount (ml/m²) | Processing pattern |
| Processing condition 1 | FIG. 3 | 30 | 12 | 20000 | 1400 | 220 | 100 | 40 | Table 6-a |
| Processing condition 2 | FIG. 1 | 30 | 12 | 20000 | 1400 | 50 | 15 | 20 | Table 6-b |
| Processing condition 3 | FIG. 1 | 30 | 12 | 20000 | 1400 | 147 | 74 | 17 | Table 6-c |
| Processing condition 4 | FIG. 1 | 30 | 12 | 20000 | 1400 | 70 | 30 | 100 | Table 6-c |
| Processing condition 5 | FIG. 1 | 30 | 15 | 20000 | 1100 | 70 | 30 | 100 | Table 6-c |
| Processing condition 6 | FIG. 1 | 30 | 20 | 20000 | 800 | 100 | 75 | 75 | Table 6-c |
| Processing condition 7 | FIG. 1 | 25 | 20 | 20000 | 800 | 90 | 40 | 70 | Table 6-c |
| Processing condition 8 | FIG. 1 | 30 | 15 | 20000 | 1100 | 70 | 30 | 100 | Table 6-c |

TABLE 6-a

| | | \multicolumn{11}{c}{Processing amount per day (m² × plate number)} | | | | | | | | | | |
|---|---|---|---|---|---|---|---|---|---|---|---|---|
| Date | | 1 Mon. | 2 Tue. | 3 Wed. | 4 Thu. | 5 Fri. | 8 Mon. | 9 Tue. | 10 Wed. | 11 Thu. | 12 Fri. | 15 Mon. |
| Plate A: | AM | 0.8 × 12 | 0.8 × 12 | 0.8 × 12 | 0.8 × 42 | 0.8 × 6 | 0 | 0.8 × 6 | 0 | 0.8 × 6 | 0.8 × 4 | 0 |
| C = 1:1 | PM | 0.8 × 12 | 0.8 × 12 | 0.8 × 12 | 0.8 × 42 | 0.8 × 6 | 0 | 0.8 × 6 | 0 | 0.8 × 6 | 0.8 × 4 | 0 |
| Plate B: | AM | 0 | 0 | 0 | 0 | 0 | 0.8 × 6 | 0 | 0.8 × 6 | 0 | 0 | 0 |
| D = 1:1 | PM | 0 | 0 | 0 | 0 | 0 | 0.8 × 6 | 0 | 0.8 × 6 | 0 | 0 | 0 |
| Total | | 19 | 19 | 19 | 67 | 10 | 10 | 10 | 10 | 10 | 6 | 0 |

TABLE 6-b

| | | \multicolumn{11}{c}{Processing amount per day (m² × plate number)} | | | | | | | | | | |
|---|---|---|---|---|---|---|---|---|---|---|---|---|
| Date | | 1 Mon. | 2 Tue. | 3 Wed. | 4 Thu. | 5 Fri. | 8 Mon. | 9 Tue. | 10 Wed. | 11 Thu. | 12 Fri. | 15 Mon. |
| Plate E | AM | 0.8 × 6 | 0.8 × 6 | 0.8 × 6 | 0.8 × 22 | 0.8 × 3 | 0.5 × 3 | 0.8 × 3 | 0.5 × 3 | 0.8 × 3 | 0.8 × 2 | 0 |
| | PM | 0.8 × 7 | 0.8 × 7 | 0.8 × 7 | 0.8 × 22 | 0.8 × 4 | 0.5 × 4 | 0.8 × 4 | 0.5 × 4 | 0.8 × 4 | 0.8 × 2 | 0 |
| Plate C | AM | 0.8 × 6 | 0.8 × 6 | 0.8 × 6 | 0.8 × 20 | 0.8 × 3 | 0 | 0.8 × 3 | 0 | 0.8 × 3 | 0 | 0 |
| | PM | 0.8 × 7 | 0.8 × 7 | 0.8 × 7 | 0.8 × 20 | 0.8 × 4 | 0 | 0.8 × 4 | 0 | 0.8 × 4 | 0 | 0 |
| Plate D | AM | 0 | 0 | 0 | 0 | 0 | 0.8 × 3 | 0 | 0.8 × 3 | 0 | 0 | 0 |
| | PM | 0 | 0 | 0 | 0 | 0 | 0.8 × 4 | 0 | 0.8 × 4 | 0 | 0 | 0 |
| Total | | 21 | 21 | 21 | 67 | 11 | 9 | 11 | 9 | 11 | 3 | 0 |

TABLE 6-c

| | | \multicolumn{11}{c}{Processing amount per day (m² × plate number)} | | | | | | | | | | |
|---|---|---|---|---|---|---|---|---|---|---|---|---|
| Date | | 1 Mon. | 2 Tue. | 3 Wed. | 4 Thu. | 5 Fri. | 8 Mon. | 9 Tue. | 10 Wed. | 11 Thu. | 12 Fri. | 15 Mon. |
| Plate | AM | 0.8 × 13 | 0.8 × 13 | 0.8 × 13 | 0.8 × 42 | 0.8 × 7 | 0.8 × 7 | 0.8 × 7 | 0.8 × 7 | 0.8 × 7 | 0.8 × 4 | 0 |
| | PM | 0.8 × 13 | 0.8 × 13 | 0.8 × 13 | 0.8 × 42 | 0.8 × 7 | 0.8 × 7 | 0.8 × 7 | 0.8 × 7 | 0.8 × 7 | 0.8 × 4 | 0 |
| Total | | 21 | 21 | 21 | 67 | 11 | 11 | 11 | 11 | 11 | 6 | 0 |

TABLE 7

| | Stability of developer sensitivity | |
|---|---|---|
| | Ordinary condition | Dry condition (Water evaporation of 30 ml/hr) |
| Example 3 | ○ | ○ |
| Comparative Example 1 | x | x |
| Comparative Example 9 | ○ | Δ |
| Example 4 | ○ | ○ |
| Comparative Example 2 | x | x |
| Example 5 | ○ | ○ |
| Comparative Example 3 | x | x |
| Example 6 | ○ | ○ |
| Comparative Example 4 | x | x |
| Example 7 | ○ | ○ |
| Comparative Example 5 | x | x |
| Example 8 | ○ | ○ |
| Comparative Example 6 | x | x |
| Example 9 | ○ | ○ |
| Comparative Example 7 | x | x |
| Example 10 | ○ | ○ |
| Comparative Example 8 | x | x |

Description of the signs
○: The developer sensitivity is almost the same as the initial one.
Δ: The developer sensitivity is varied from the initial one but no image deterioration nor smudging occur.
x: Highlight of dot images cannot be faithfully recorded, or smudges occur in non-image areas.

According to the present invention, a developer stored in a developer tank is replenished with a replenisher to compensate the reduction of the developing activity caused by time elapse as well as plate processing based on predetermined replenishing conditions of the developer to match with the actual operating condition of the automatic developing apparatus, and further in the case where the measured value of the electric conductivity of the replenished developer exceeds the predetermined target value, the diluent is replenished into the developer until the measured value becomes lower than the target value.

Accordingly, the fluctuation of the developer sensitivity caused by the changes in developing conditions is minimized while using a developing unit of an automatic developing apparatus having an economical and simple structure. Therefore, a stable developing operation is performed with a small-sized equipment and a low cost.

Further, the electric conductivity target value is calculated from the replenisher replacement ratio, and one of a dilution ratio of the sum of the diluent and the diluent replenished for lowering the electric conductivity of the developer in the developer tank, relative to the replenisher, and the ratio of the integral amount of the replenisher for aging relative to the product of the replenisher replacement ratio with the amount of the developer. Thus, the developing sensitivity is always maintained stably by obtaining the proper target value of the conductivity even under variation of proceeding frequency.

Besides, at least one of the developer tank and the automatic developing apparatus is structured to suppress air ventilation so that the $CO_2$ concentration of the air in a direct contact with the developer in the developer tank is kept below 300 ppm. Thus, the fluctuation of the replenishing amount for aging based on changes of the external circumferences can be restrained.

While only certain embodiments of the invention have been specifically described herein, it will apparent that numerous modifications may be made thereto without departing from the spirit and scope of the invention.

What is claimed is:

1. An automatic developing apparatus for photosensitive materials, comprising:
    a developer tank storing a developer;
    a replenishing unit replenishing a predetermined amount of a replenisher for developer to maintain a developing activity of the developer in the developer tank;
    a memory for memorizing a first preset replenishing condition of the replenisher to compensate the reduction of the developing activity during working and/or stopped period, and a second preset replenishing condition of the replenisher to compensate the reduction of developing activity caused by the processing of the photosensitive materials;
    a calculating unit calculating a replenisher replacement ratio being a ratio that a charged solution of the developer is replaced by at least one of the replenisher and a diluent replenished for reducing an electric conductivity of the developer;
    an electric conductivity sensor measuring the electric conductivity of the developer; and
    a diluent replenishing unit replenishing the diluent to the developer tank until the electric conductivity becomes lower than an electric conductivity target value previously calculated from the replenisher replacement ratio, when the measured value of electric conductivity exceeds the target value.

2. The automatic developing apparatus according to claim 1, wherein the electric conductivity target value is calculated from the replenisher replacement ratio, and one of the following values:
    a) a dilution ratio of the sum of a diluent for diluting the replenisher and the diluent replenished for lowering the electric conductivity of the developer in the developer tank, relative to the replenisher, and
    b) a ratio of the integral amount of the replenisher which is replenished to compensate the reduction of the developing activity during working and/or stopping period, relative to the product of the replenisher replacement ratio with the amount of the developer.

3. The automatic developing apparatus according to claim 1, wherein at least one of the developer tank and the automatic developing apparatus is structured to suppress air ventilation so that the $CO_2$ concentration of the air in a direct contact with the developer in the developer tank is kept below 300 ppm.

4. A method of replenishing a replenisher for a developer in an automatic developing apparatus for photosensitive materials, comprising the steps of:
    a) replenishing a replenisher for developer based on a first predetermined replenishing condition so as to compensate the reduction of a developing activity during working and/or stopped period;
    b) replenishing the replenisher based on a second predetermined replenishing condition so as to compensate the reduction of the developing activity caused by the processing of the photosensitive materials;
    c) measuring an electric conductivity of the developer replenished with the replenisher in the steps a) and b); and
    d) replenishing a diluent into the developer until the electric conductivity of the developer falls below an electric conductivity target value predetermined by using a replenisher replacement ratio, when the measured value of the electric conductivity of the developer exceeds the target value.

5. The method according to claim 4, wherein the electric conductivity target value is calculated from the replenisher replacement ratio, and one of the following values:
    a) a dilution ratio of the sum of a diluent for diluting the replenisher and the diluent replenished for lowering the electric conductivity of the developer in the developer tank, relative to the replenisher, and
    b) a ratio of the integral amount of the replenisher which is replenished to compensate the reduction of the developing activity during working and/or stopping period, relative to the product of the replenisher replacement ratio with the amount of the developer.

* * * * *